United States Patent
Lee

(10) Patent No.: US 9,607,950 B2
(45) Date of Patent: Mar. 28, 2017

(54) PACKAGE SUBSTRATE AND SEMICONDUCTOR PACKAGE INCLUDING THE SAME

(71) Applicant: Byung Woo Lee, Hwaseong-si (KR)

(72) Inventor: Byung Woo Lee, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 267 days.

(21) Appl. No.: 14/455,854

(22) Filed: Aug. 8, 2014

(65) Prior Publication Data

US 2015/0221598 A1    Aug. 6, 2015

(30) Foreign Application Priority Data

Feb. 5, 2014   (KR) .......................... 10-2014-0013234

(51) Int. Cl.
*H01L 23/48* (2006.01)
*H01L 23/552* (2006.01)
(Continued)

(52) U.S. Cl.
CPC .......... *H01L 23/552* (2013.01); *H01L 27/228* (2013.01); *H01L 43/02* (2013.01);
(Continued)

(58) Field of Classification Search
CPC ....... H01L 2924/00; H01L 2224/73265; H01L 2924/3025; H01L 43/08; H01L 2924/00014; H01L 2224/48227; H01L 2224/32225; H01L 2224/97; H01L 2924/181; H01L 2924/00012; H01L 2224/85399; H01L 2224/16225; H01L 23/552; H01L 2224/32145; G11C 11/16; G11C 11/15; G01R 33/098; G01R 33/09; G01R 33/093; H05K 1/0222; H05K 1/0245; H05K 3/4069; H05K 3/4602; H05K 3/4614; H05K 3/4644
(Continued)

(56) References Cited

U.S. PATENT DOCUMENTS 6,625,040 B1   9/2003  Tuttle
6,921,965 B1 * 7/2005  Ray .......................... G11C 11/16
                                                          257/296

(Continued)

FOREIGN PATENT DOCUMENTS

JP      07066587      10/1995
KR    100483609 B      2/2004
(Continued)

*Primary Examiner* — Alesa Allgood
(74) *Attorney, Agent, or Firm* — Renaissance IP Law Group LLP

(57) ABSTRACT

There is provided a package substrate including: a body unit including a plurality of base substrates and having a mounting region allowing at least one semiconductor device to be mounted thereon; and a plurality of magnetic field shielding units including a ferromagnetic material and provided within the body unit, wherein the plurality of magnetic field shielding units may be respectively disposed on the plurality of different base substrates such that a magnetic field shielding region defined by the plurality of magnetic field shielding units corresponds to the mounting region.

15 Claims, 17 Drawing Sheets

(51) Int. Cl.
*H01L 43/02* (2006.01)
*H01L 27/22* (2006.01)

(52) U.S. Cl.
CPC ............... *H01L 2224/16225* (2013.01); *H01L 2924/0002* (2013.01); *H01L 2924/15311* (2013.01)

(58) Field of Classification Search
USPC ........................................ 257/421, 659, 660
See application file for complete search history.

(56) References Cited

U.S. PATENT DOCUMENTS

| | | | |
|---|---|---|---|
| 6,924,168 B2 | 8/2005 | Tuttle | |
| 8,324,028 B2 | 12/2012 | Kissing et al. | |
| 8,492,881 B2 | 7/2013 | Kuroiwa et al. | |
| 2004/0018658 A1* | 1/2004 | Mano | H01L 21/4857 438/106 |
| 2004/0032010 A1 | 2/2004 | Kools et al. | |
| 2004/0126905 A1 | 7/2004 | Bhattacharyya et al. | |
| 2004/0150091 A1 | 8/2004 | Stobbs | |
| 2005/0226030 A1 | 10/2005 | Kato et al. | |
| 2007/0137890 A1* | 6/2007 | Tagi | H05K 1/0233 174/260 |
| 2008/0122047 A1 | 5/2008 | Honer et al. | |
| 2008/0189472 A1 | 8/2008 | Tanaka | |
| 2008/0215803 A1 | 9/2008 | Tanaka | |
| 2009/0161266 A1 | 6/2009 | Wang et al. | |
| 2009/0257151 A1 | 10/2009 | Zhang et al. | |
| 2009/0302837 A1 | 12/2009 | Phan et al. | |
| 2009/0325319 A1 | 12/2009 | Horng et al. | |
| 2010/0019298 A1 | 1/2010 | Drewes | |
| 2010/0044680 A1 | 2/2010 | Hong et al. | |
| 2010/0072566 A1 | 3/2010 | Kang et al. | |
| 2010/0164077 A1* | 7/2010 | Bando | H01L 23/49503 257/659 |
| 2010/0295140 A1* | 11/2010 | Theuss | B82Y 25/00 257/421 |
| 2011/0060871 A1 | 3/2011 | Tanaka | |
| 2011/0060873 A1 | 3/2011 | Tanaka | |
| 2011/0060874 A1 | 3/2011 | Tanaka | |
| 2011/0096443 A1 | 4/2011 | Zhang et al. | |
| 2011/0139497 A1* | 6/2011 | Li | H01L 23/49827 174/257 |
| 2011/0140218 A1 | 6/2011 | Drewes | |
| 2011/0291246 A1* | 12/2011 | Jo | H01L 24/81 257/621 |
| 2012/0193737 A1 | 8/2012 | Pang et al. | |
| 2012/0211846 A1* | 8/2012 | Li | H01L 23/552 257/421 |
| 2013/0187272 A1* | 7/2013 | Ozawa | H01L 25/0657 257/738 |

FOREIGN PATENT DOCUMENTS

| | | |
|---|---|---|
| KR | 20040017900 A | 3/2004 |
| KR | 100712836 B | 4/2007 |
| KR | 100716679 B | 5/2007 |
| KR | 100733287 B | 6/2007 |

* cited by examiner

PACKAGE SUBSTRATE AND SEMICONDUCTOR PACKAGE INCLUDING THE SAME

CROSS-REFERENCE TO RELATED APPLICATION

This application claims the benefit of Korean Patent Application No. 10-2014-0013234 filed on Feb. 5, 2014, with the Korean Intellectual Property Office, the disclosure of which is incorporated herein by reference.

BACKGROUND

The present disclosure relates to a package substrate and a semiconductor package including the same.

Magnetic memories are semiconductor devices in the spotlight as next-generation memories, having advantages of consuming a relatively small amount of power during data writing and reading operations and having a large amount of memory cells integrated in a small area. Magnetic memories use the principle of changing a magnetization direction of a free layer included in a magnetic tunnel junction (MTJ) element included in each memory cell to write data to or read data from such a magnetic memory.

In terms of the characteristics of magnetic memories to which data is written or from which data is read by adjusting a magnetization direction of a free layer included in an MTJ element, the possibility exists that data may be inadvertently recorded or lost due to the influence of an external magnetic field. Thus, in order to enhance the reliability of magnetic memories, semiconductor package structures capable of effectively interrupting a magnetic field that may be introduced from the outside are required.

SUMMARY

An aspect of the present disclosure may provide a package substrate and a semiconductor package including the same capable of securing reliability in magnetic memories by interrupting a magnetic field introduced from the outside.

According to an aspect of the present disclosure, a package substrate may include: a body unit including a plurality of base substrates and having a mounting region allowing at least one semiconductor device to be mounted thereon; and a plurality of magnetic field shielding units including a ferromagnetic material and provided within the body unit, wherein the plurality of magnetic field shielding units may be respectively disposed on the plurality of different base substrates such that a magnetic field shielding region defined by the plurality of magnetic field shielding units corresponds to the mounting region.

The magnetic field shielding region may have the area greater than or equal to that of the mounting region.

At least a portion of the plurality of magnetic field shielding units may have overlapping regions within the magnetic field shielding region.

The body unit may include: a plurality of circuit patterns respectively disposed on the plurality of base substrates; and a plurality of vias penetrating through at least one of the plurality of base substrates and electrically connecting the plurality of circuit patterns respectively disposed on the plurality of different base substrates.

At least one of the plurality of magnetic field shielding units may have a via hole penetrated by at least a portion of the plurality of vias.

At least a portion of the vias may be electrically separated from the magnetic field shielding unit having the via hole within the via hole.

The via hole may overlap with at least one of the plurality of magnetic field shielding units.

The plurality of circuit patterns may be electrically separated from the plurality of magnetic field shielding units.

The plurality of circuit patterns may include a power source circuit pattern supplying at least one of a source voltage and a ground voltage, and at least a portion of the plurality of magnetic field shielding units may be disposed to be adjacent to the power source circuit pattern.

The plurality of magnetic field shielding units may include at least one of iron (Fe), cobalt (Co), and nickel (Ni).

The mounting region may include solder bumps formed on one surface of the body unit and electrically connected to electrodes of the one or more semiconductor devices.

According to another aspect of the present disclosure, a semiconductor package may include: a substrate including a magnetic field shielding unit; and one or more semiconductor devices disposed in a mounting region defined on one surface of the substrate, wherein the magnetic field shielding unit may have the area corresponding to the mounting region.

The one or more semiconductor devices may include a magnetic memory device.

The magnetic field shielding unit may be disposed within the substrate.

The magnetic field shielding unit may be a plurality of magnetic field shielding units, and the plurality of magnetic field shielding units may be disposed in different positions within the substrate in a thickness direction of the substrate.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
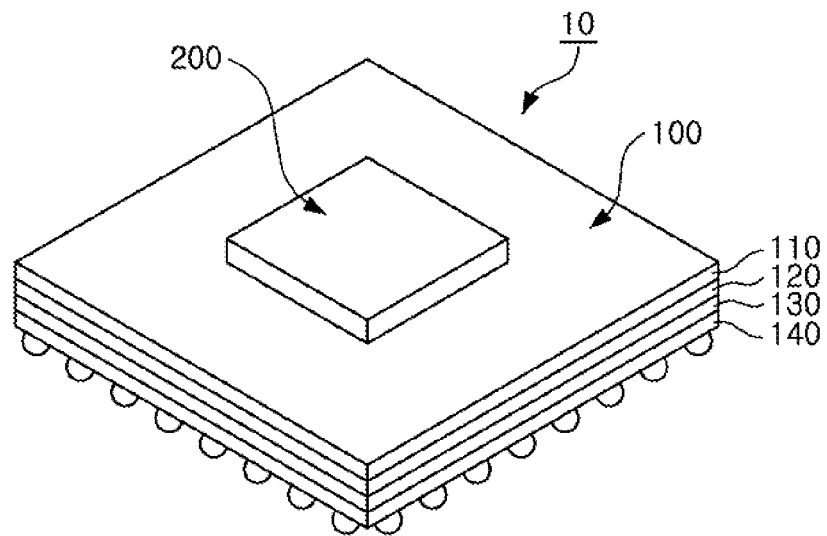
FIG. 1 is a perspective view schematically illustrating a semiconductor package according to an exemplary embodiment of the present disclosure.

Hereinafter, exemplary embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 is a perspective view schematically illustrating a semiconductor package according to an exemplary embodiment of the present disclosure.

Referring to FIG. 1, a semiconductor package 10 according to an exemplary embodiment of the present disclosure may include a package substrate 100, and a semiconductor device 200. The semiconductor device 200 is not particularly limited to and may be a non-volatile memory device, for example. Also, in FIG. 1, it is illustrated that a single semiconductor device 200 is mounted on the package substrate 100, but, alternatively, a plurality of semiconductor devices 200 may be mounted on the package substrate 100.

The package substrate 100 may include a plurality of stacked layers 110, 120, 130, and 140. In an exemplary embodiment of the present disclosure, the plurality of stacked layers 110, 120, 130, and 140 may include a plurality of base substrates formed of an insulating material and/or a metal, and the plurality of base substrates may form a body unit with respect to the package substrate 100. Also, circuit patterns may be formed on the plurality of base substrates, and vias electrically connecting the circuit patterns formed on the different layers 110, 120, 130, and 140 may be formed within the base substrates.

Meanwhile, in the exemplary embodiment of the present disclosure, the semiconductor device 200 may be a memory device, in particular, a magnetic memory device reading and writing data using changes in resistance. In case of a magnetic memory device, data may be written or read using changes in resistance of a magnetic tunnel junction (MTJ) element included in a memory cell array, and here, changes in resistance of the MTJ element occur according to a magnetization direction of a free layer included in the MTJ element.

Thus, in the case in which the magnetization direction of the free layer included in the MTJ element is changed due to a magnetic field introduced from the outside, data may be unintentionally lost. Thus, the semiconductor package 10 including a magnetic memory device requires a unit for shielding a magnetic field that may be introduced to the magnetic memory device.

In the exemplary embodiment of the present disclosure, a magnetic field shielding unit may be provided within the package substrate 100 to protect the semiconductor device 200 against a magnetic field that may be introduced from the outside. In the exemplary embodiment, the magnetic field shielding unit provided within the package substrate 100 may be disposed in a portion of at least one of the plurality of layers 110, 120, 130, and 140. Also, at least partial regions of the magnetic field shielding units provided in the different layers 110, 120, 130, and 140 may overlap with each other. In this case, a magnetic field shielding region defined by connecting boundaries of the magnetic field shielding units may correspond to a mounting region of an upper surface of the package substrate 100. The magnetic field shielding region may have the area equal to or greater than the mounting area to prevent a magnetic field introduced from the outside through the package substrate 100 from reaching the semiconductor device 200.

Figure 2:
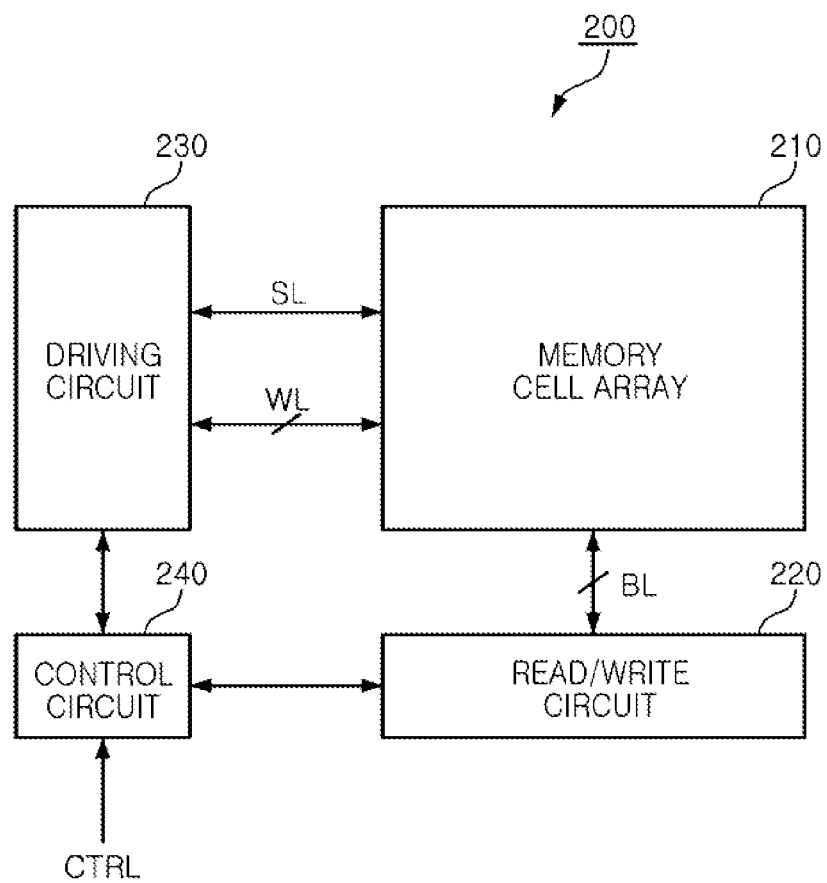
FIG. 2 is a block diagram schematically illustrating a semiconductor device that may be included in a semiconductor package according to an exemplary embodiment of the present disclosure.

FIG. 2 is a block diagram schematically illustrating a semiconductor device that may be included in a semiconductor package according to an exemplary embodiment of the present disclosure. It is assumed that the semiconductor device according to the present exemplary embodiment is a magnetic memory device for the purposes of description, but the present disclosure is not limited thereto.

Referring to FIG. 2, a magnetic memory device 200 according to the exemplary embodiment of the present disclosure may include a memory cell array 210, a read/write circuit 220, a driving circuit 230, and a control circuit 240.

The memory cell array 210 may include a plurality of memory cells, and the plurality of memory cells may be arranged in a plurality of columns and rows. The plurality of memory cells included in the memory cell array 210 may be connected to the driving circuit 230 through word lines WL, source lines SL, or the like, and may be connected to the read/write circuit 220 through bit lines BL. In the exemplary embodiment of the present disclosure, a plurality of memory cells arranged in the same row may be connected to the same word line and a plurality of memory cells arranged in the same column may be connected to the same bit line BL.

The plurality of memory cells included in the memory cell array 210 may be divided into a plurality of memory blocks. Each of the memory blocks may include a plurality of word lines WL, a plurality of bit lines BLS, and at least one source line. A source line SL may be provided in each memory cell or a single source line SL may be provided in a plurality of memory cells.

The driving circuit 230 and the read/write circuit 220 may be operated by the control circuit 240. In the exemplary embodiment of the present disclosure, the driving circuit 230 may receive address information from the outside and decode the received address information to select at least a portion of the word lines WL, common source lines CSL, and string select lines SSL. The driving circuit 230 may include a driving circuit with respect to each of the word lines WL, the string select lines SSL, and the common source lines CSL.

The read/write circuit 220 may select at least a portion of bit lines BL connected to the memory cell array 210 according to a command received from the control circuit 240. The read/write circuit 220 may read data stored in memory cells connected to at least a selected portion of the bit lines BL or may write data to memory cells connected to the at least a selected portion of bit lines BL. In order to perform the aforementioned operation, the read/write circuit 220 may include circuits such as a page buffer, an input/output buffer, a data latch, and the like.

The control circuit 240 may control operations of the driving circuit 230 and the read/write circuit 220 in response to a control signal CTRL transmitted from the outside. In case of reading data stored in the memory cell array 210, the control circuit 240 may control an operation of the driving circuit 230 to supply a voltage for a reading operation to a word line WL storing data desired to be read. When a voltage for a reading operation is supplied to a particular word line WL, the control circuit 240 may control the read/write circuit 220 to read data stored in memory cells connected to the particular word line WL to which the voltage for a reading operation has been supplied.

Meanwhile, in case of writing data to the memory cell array 210, the control circuit 240 may control an operation of the driving circuit 230 to supply a voltage for a writing operation to a particular word line WL to which data is desired to be written. When a voltage for a writing operation is supplied to a particular word line WL, the control circuit 240 may control the read/write circuit 220 to write data to memory cells connected to the particular word line WL to which the voltage for a writing operation has been supplied.

Figure 3:
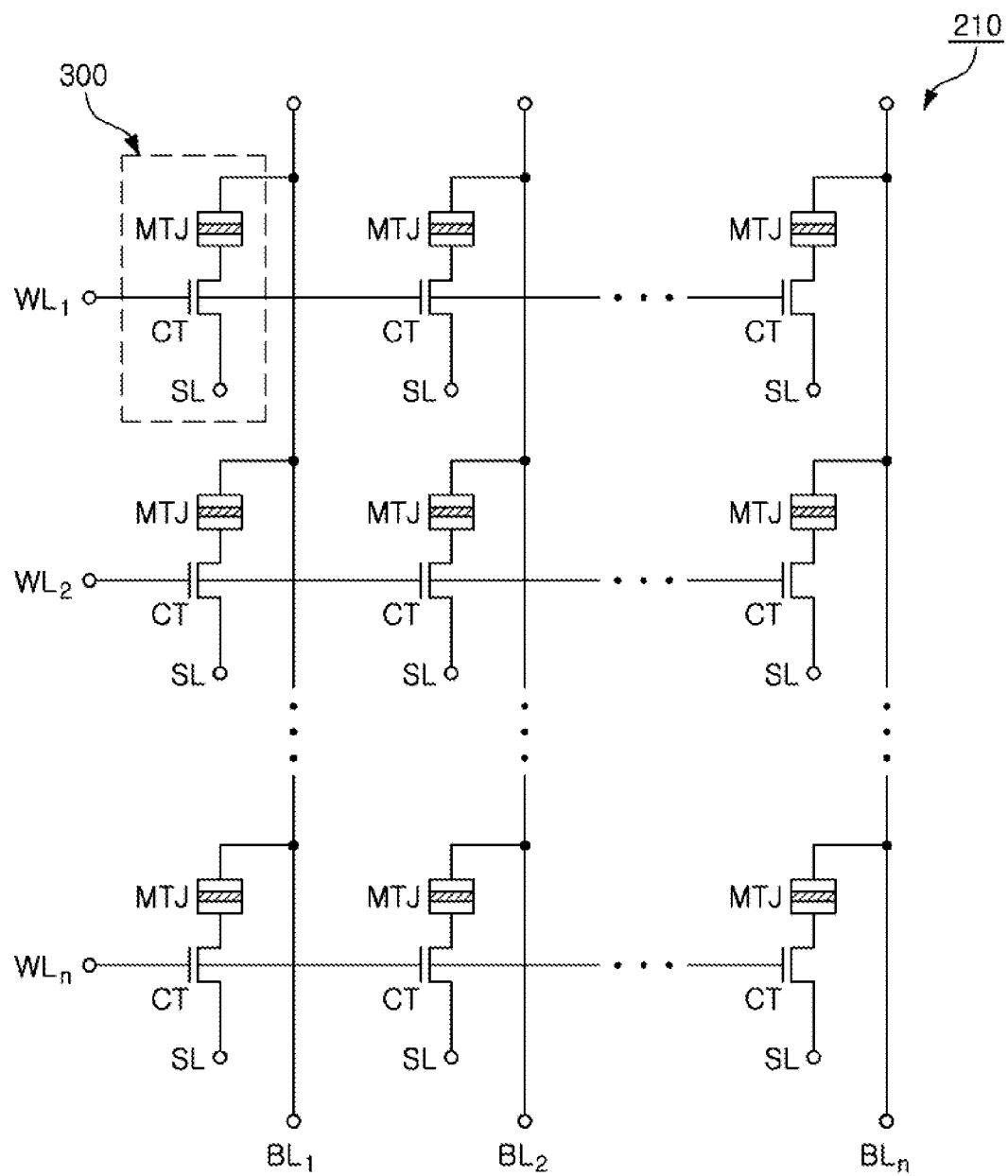
FIG. 3 is a circuit diagram illustrating a memory cell array of a semiconductor device that may be included in a semiconductor package according to an exemplary embodiment of the present disclosure.

FIG. 3 is a circuit diagram illustrating a memory cell array of a semiconductor device that may be included in a semiconductor package according to an exemplary embodiment of the present disclosure.

Referring to FIG. 3, a memory cell array 210 of the magnetic memory device 200 may include a plurality of word lines $WL_1$ to $WL_n$, a plurality of bit lines $BL_1$ to $BL_n$, and a plurality of memory cells 300 disposed in regions in which the plurality of word lines $WL_1$ to $WL_n$ and the plurality of bit lines $BL_1$ to $BL_n$ intersect. In a case in which the memory cells 300 are implemented as spin transfer torque magnetoresistive random access memory (STT-MRAM) cells, the respective memory cells 300 may include a magnetic tunnel junction (MTJ) element containing a magnetic material. Meanwhile, the memory cells 300 may include a cell transistor (CT), respectively, in addition to the MTJ element.

Each cell transistor CT may operate in response to a signal transmitted through the plurality of word lines $WL_1$ to $WL_n$. The driving circuit 230 of FIG. 2 may include a word line driving circuit transmitting a signal to each cell transistor CL through the plurality of word lines $WL_1$ to $WL_n$. Also, the cell transistor CT and the MTJ element included in each memory cell 300 may be connected to any one of the plurality of bit lines $BL_1$ to $BL_n$ and a source line SL. The plurality of memory cells 300 may be commonly connected to a single source line SL.

The plurality of bit lines $BL_1$ to $BL_n$ may be connected to the read/write circuit 220. The read/write circuit 220 may request a signal for a reading or writing operation from the memory cells 300 based on a command transmitted from the control circuit 240.

Figure 4A:
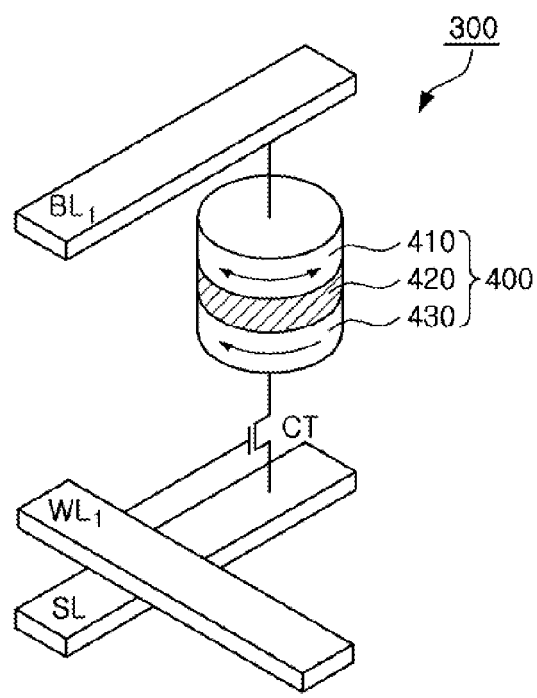
FIGS. 4A through 4C are views illustrating operations of a semiconductor device that may be included in a semiconductor package according to an exemplary embodiment of the present disclosure.
Figure 4B:
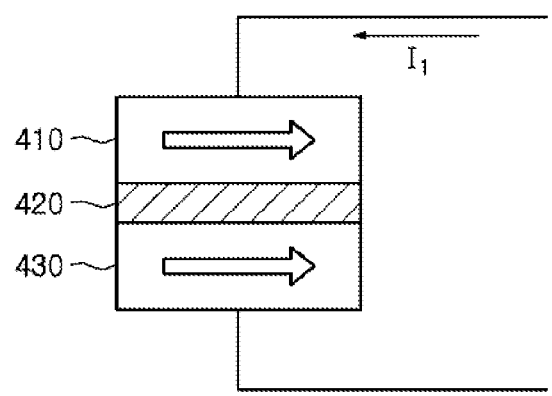
Figure 4C:
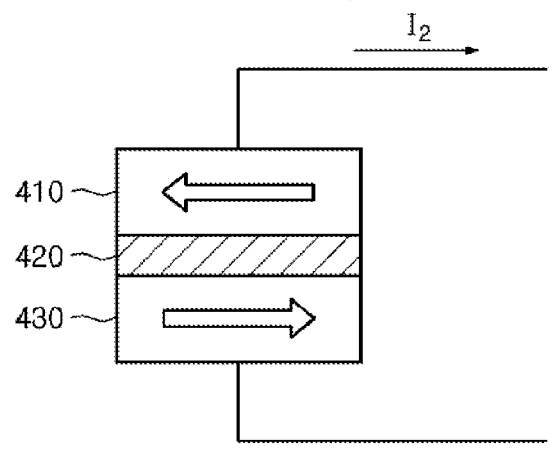

FIGS. 4A through 4C are views illustrating operations of a semiconductor device that may be included in a semiconductor package according to an exemplary embodiment of the present disclosure. An operation of the memory cell 300 included in the memory cell array 210 illustrated in FIG. 3 will be described with reference to FIGS. 4A through 4C.

Referring to FIG. 4A, the memory cell 300 may include an MTJ element 400 and a cell transistor CT. A gate terminal of the cell transistor CT may be connected to a word line WL1, one electrode of the cell transistor CT is connected to a bit line BL1 through the MTJ element 400, and another electrode of the cell transistor CT may be connected to a source line SL.

The MTJ element 400 may include a free layer 410, a fixed layer 430, and a tunnel layer 420 disposed between the free layer 410 and the fixed layer 430. A magnetization direction of the fixed layer 430 is fixed and not changed, and that of the free layer 410 may change in the same direction as that of the fixed layer 430 or in a reverse direction according to conditions. In order to fix the magnetization direction of the fixed layer 430, an anti-ferromagnetic layer may be further included in the MTJ element 400.

A reading operation and write operation performed on the memory cell 300 will be described with reference to FIGS. 4B and 4C. First, referring to FIG. 4B, when a current $I_1$ is applied to the MTJ element 400, a magnetization direction of the free layer 410 may be determined as a direction identical to a magnetization direction of the fixed layer 430. Free electrons having a spin direction identical to that of the fixed layer 430 apply torque to the free layer 410 due to the current $I_1$ flowing from the free layer 410 to the fixed layer 430, and accordingly, the free layer 410 may be magnetized to be parallel to the fixed layer 430.

Meanwhile, as illustrated in FIG. 4C, when a current $I_2$ flowing from the fixed layer 430 of the MTJ element 400 to the free layer 410 thereof is applied, free electrons having spin in a direction opposite to that of the fixed layer 430 may apply torque to the free layer 410. Thus, the free layer 410 may be magnetized to be anti-parallel to the fixed layer 430.

When the free layer 410 and the fixed layer 430 are magnetized to be parallel to each other as illustrated in FIG. 4B, the MTJ element 400 has relatively low resistance, and when the free layer 410 and the fixed layer 430 are magnetized to be anti-parallel to each other as illustrated in FIG. 4C, the MTJ element 400 may have relatively large resistance. Thus, data recorded in the memory cell 300 may be read according to a magnitude of a resistance value when a read current for reading resistance of the MTJ element 400 is applied. For example, in a case in which resistance of the MTJ element 400 is small, data "0" may be read, and when resistance of the MTJ element 400 is large, data "1" may be read. A read current applied to the memory cell 300 during a read operation has a very small value, relative to currents $I_1$ and $I_2$ applied to write data, and thus, a magnetization direction of the free layer 410 may not be changed by the read current.

Meanwhile, in FIGS. 4A through 4C, only the MTJ element 400 in which a magnetization direction is horizontal is illustrated, but alternatively, the memory cell 300 may also be implemented with an MTJ element in which a magnetization direction is vertical. Also, if necessary, the MTJ element 400 may include an anti-ferromagnetic layer, a plurality of free layers 410 or fixed layers 430.

As described above, in the MTJ element, the free layer 410 may have a magnetization direction changing due to an electric/magnetic factor provided from both within and outside of the memory cell 300. Thus, in order to increase reliability of data written to the memory cell 300, a magnetic field that may be unintentionally introduced to the MTJ element 400 needs to be blocked, and in the exemplary embodiment of the present disclosure, a magnetic field introduced from the outside may be blocked by using a magnetic field shielding unit included in the package substrate 100

FIGS. 5A through 5D are plan views schematically illustrating a package substrate according to an exemplary embodiment of the present disclosure.

FIGS. 5A through 5D may be plan views illustrating a plurality of layers 110, 120, 130, and 140 included in the package substrate 100 illustrated in FIG. 1. The plurality of layers 110, 120, 130, and 140 illustrated in FIGS. 5A through 5D may be stacked, and base substrates 113, 123, 133, and 143 respectively included in the layers 110, 120, 130, and 140 may constitute a body unit. First, referring to FIG. 5A, the first layer 110 included in the package substrate 100 may have a first base substrate 113, and a first magnetic field shielding unit 115 may be formed in the first base substrate 113. Also, in FIG. 5A, a mounting region 150 defined on an upper surface of the package substrate 100 is indicated. The mounting region 150 may be defined as a region in which the semiconductor device 200 disposed on an upper surface of the package substrate 100 and solder bumps, a bonding pad, or a bonding wire on an upper surface of the package substrate 100, and the like, are electrically connected. The first magnetic field shielding unit 115 may be disposed such that at least a portion thereof overlaps with the mounting region 150.

Figure 5A:
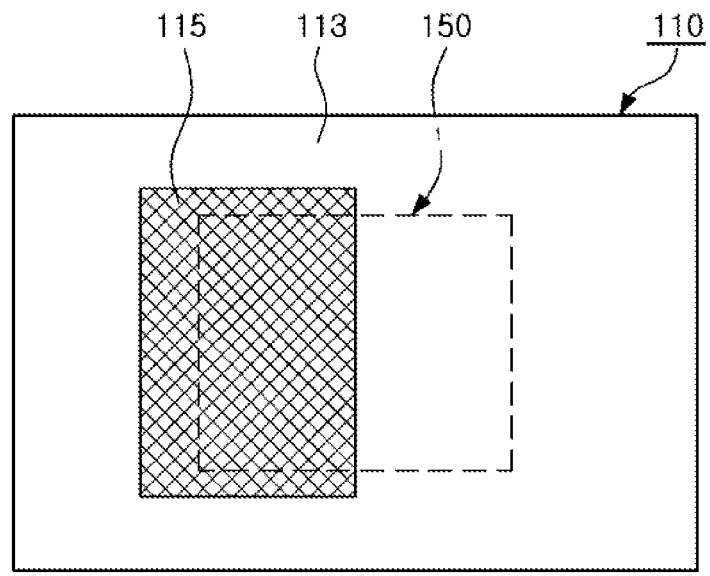
FIGS. 5A through 5D are plan views schematically illustrating a package substrate according to an exemplary embodiment of the present disclosure.
Figure 5B:
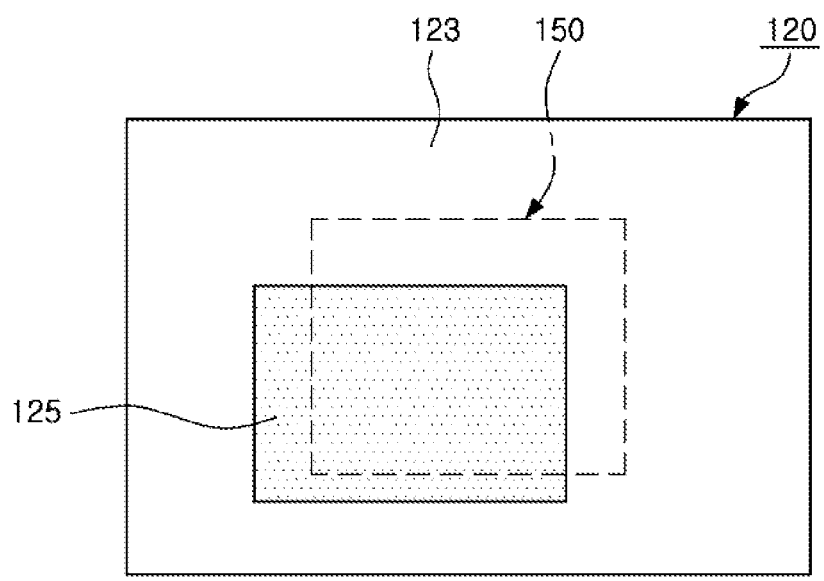

Referring to FIG. 5b, the second layer 120 may include the second base substrate 123, and a second magnetic field shielding unit 125 may be formed in the second base substrate 123. Like the first magnetic field shielding unit 115, the second magnetic field shielding unit 125 may overlap with at least a portion of the mounting region 150, and in particular, the second magnetic field shielding unit 125 may overlap with the mounting region 150 in a region different from that of the first magnetic field shielding unit 115. Also, at least a portion of the second magnetic field shielding unit 125 may overlap with a portion of the first magnetic field shielding unit 115 on a plane parallel to an upper surface of the package substrate 100.

Figure 5C:
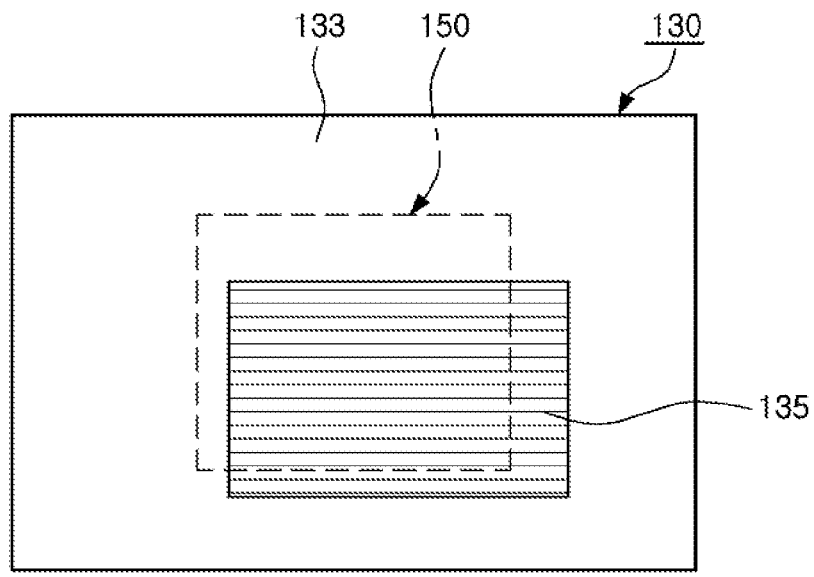
Figure 5D:
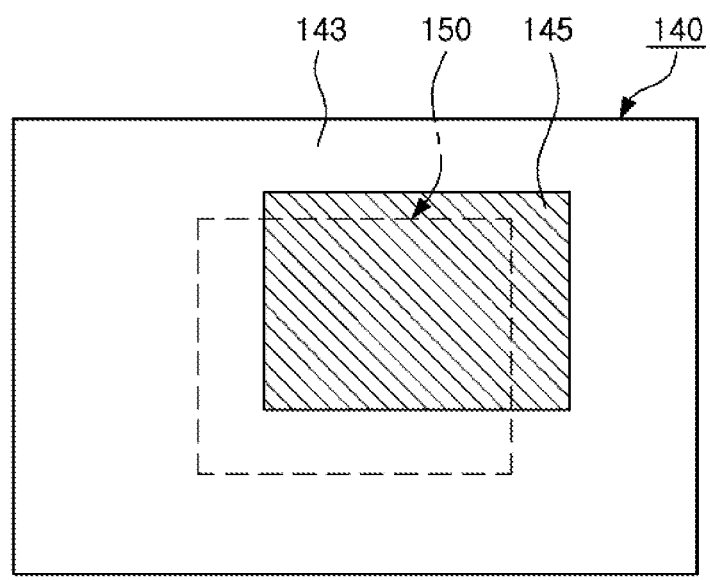

The third layer 130 illustrated in FIG. 5C may include the third base substrate 133, and a third magnetic field shielding unit 135 may be provided in the third base substrate 133. Also, the fourth layer 140 illustrated in FIG. 5D may include the fourth base substrate 143, and a fourth magnetic field shielding unit 145 may be provided on the fourth base substrate 143. Like the first and second magnetic field shielding units 115 and 125, the third magnetic field shielding unit 135 and the fourth magnetic field shielding unit 145 may include at least a portion overlapping with the mounting region 150. Also, each of the first to fourth magnetic field shielding units 115, 125, 135, and 145 may include at least a portion overlapping with at least one of the other magnetic field shielding units 115, 125, 135, and 145.

Meanwhile, in FIGS. 5A through 5D, only the magnetic field shielding units 115, 125, 135, and 145 are illustrated as being disposed on the base substrates 113, 123, 133, and 143 respectively included in the layers 110, 120, 130, and 140. However, besides the magnetic field shielding units 115, 125, 135, and 145, circuit patterns, pads having electrical conductivity, and the like, may also be additionally provided. Also, a plurality of vias may be formed respectively within the base substrates 113, 123, 133, and 143 in order to electrically connect pads respectively formed on the base substrates 113, 123, 133, and 143 to pads respectively provided in the other base substrates 113, 123, 133, and 143.

Figure 6:
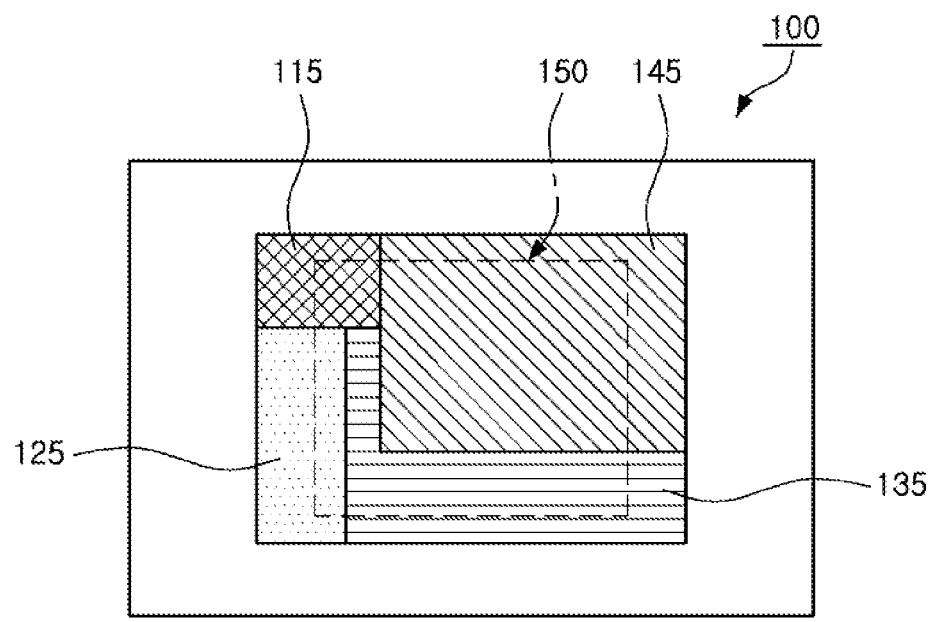
FIG. 6 is a plan view specifically illustrating a configuration of magnetic field shielding units of the package substrate illustrated in FIGS. 5A through 5D.

FIG. 6 is a plan view specifically illustrating a configuration of magnetic field shielding units of the package substrate illustrated in FIGS. 5A through 5D.

Referring to FIG. 6, the package substrate 100 that may be included in the semiconductor package 10 according to the exemplary embodiment of the present disclosure is illustrated. The package substrate 100 may include a plurality of layers 110, 120, 130, and 140, and the magnetic field shielding units 115, 125, 135, and 145 illustrated in FIGS. 5A through 5D may be respectively provided in the layers 110, 120, 130, and 140. The layers 110, 120, 130, and 140 may be stacked, and the base substrates 113, 123, 133, and 143 respectively included in the layers 110, 120, 130, and 140 may provide a body unit. FIG. 6 illustrates a plan view of the package substrate 100 including the plurality of sequentially stacked layers 110, 120, 130, and 140 to illustrate functions and operations of the magnetic field shielding units 115, 125, 135, and 145. The magnetic field shielding units 115, 125, 135, and 145 respectively provided in the layers 110, 120, 130, and 140 are illustrated as overlapping with each other.

In FIGS. 5A though 5D, the base substrates 113, 123, 133, and 143 respectively included in the plurality of layers 110, 120, 130, and 140 may have substantially the same size and shape. Also, the magnetic field shielding units 115, 125, 135, and 145 may include at least portions overlapping with each other on one surface of the package substrate 100.

The plurality of first to fourth layers 110 to 140 may be sequentially stacked, and portions of the magnetic field shielding units 115, 125, 135, and 145 may overlap with other magnetic field shielding units 115, 125, 135, and 145, respectively. The plurality of overlapping magnetic field shielding units 115, 125, 135, and 145 may define a magnetic field shielding region, and the magnetic field shielding region may be defined by the outermost boundaries of the magnetic field shielding units 115, 125, 135, and 145. In FIG. 6, the magnetic field shielding region defined by the plurality of magnetic field shielding units 115, 125, 135, and 145 is illustrated as having a rectangular shape; however, the magnetic field shielding region may be defined as having any other shape depending on shapes and sizes of the magnetic field shielding units 115, 125, 135, and 145 and sizes and shapes of regions in which the magnetic field shielding units 115, 125, 135, and 145 overlap with each other.

The magnetic field shielding units 115, 125, 135, and 145 may include a ferromagnetic material. For example, the magnetic field shielding units 115, 125, 135, and 145 may include iron (Fe), an iron-cobalt (Fe—Co) alloy, a nickel-iron (Ni—Fe) alloy, and the like. In case of an alloy, the magnetic field shielding units 115, 125, 135, and 145 may be formed of a material such as Permalloy. The magnetic field shielding units 115, 125, 135, and 145 may be designed such that the magnetic field shielding region has the area greater than or equal to a region on which the semiconductor device 200 is mounted, whereby a magnetic field transmitted from the outside to the semiconductor device 200, for example a magnetic field transmitted through vias formed within the package substrate 100, may be effectively blocked.

FIGS. 7A through 7D are plan views schematically illustrating package base substrates according to an exemplary embodiment of the present disclosure. FIG. 8 is a plan view specifically illustrating a configuration of a magnetic field shielding unit of the package substrate illustrated in FIGS. 7A through 7D. In FIGS. 7A through 7D and 8, four layers 510, 520, 530, and 540 that may be included in a package substrate 500 are illustrated, and layers 510, 520, 530, and 540 may be stacked. The semiconductor device 200 may be mounted on the package substrate 500.

The layers 510, 520, 530, and 540 may respectively include base substrates 513, 523, 533, and 543, and the base substrates 513, 523, 533, and 543 may provide a body unit of the package substrate. Magnetic field shielding units 515, 525, 535, and 545 may respectively be formed on base substrates 513, 523, 533, and 543. At least portions of the magnetic field shielding units 515, 525, 535, and 545 may overlap on the plane illustrated in FIGS. 7A through 7D to define a magnetic field shielding region. Similar to the case illustrated in FIG. 6, the magnetic field shielding region may have the area greater than or equal to a mounting region 550.

Figure 7A:
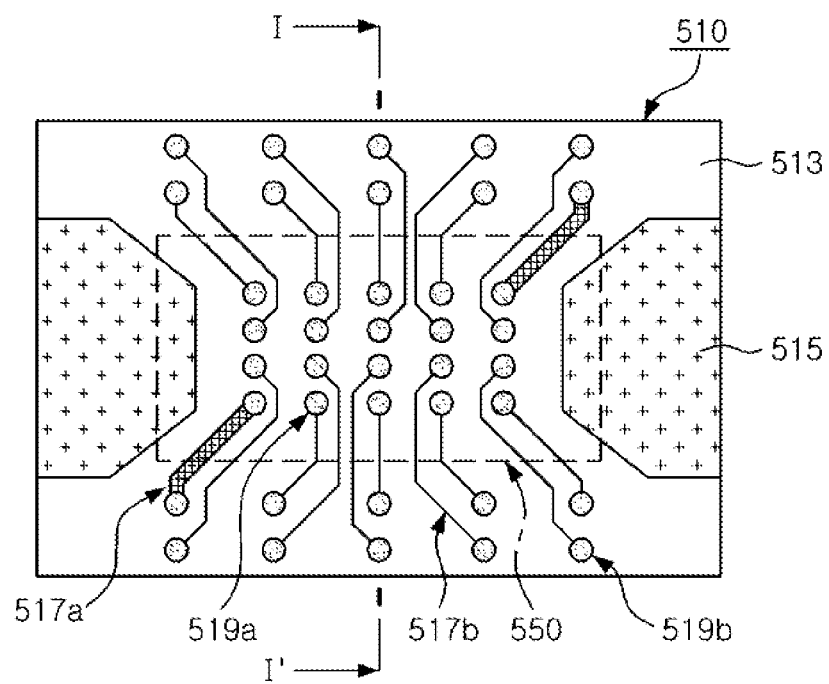
FIGS. 7A through 7D are plan views schematically illustrating package substrates according to an exemplary embodiment of the present disclosure.
Figure 8:
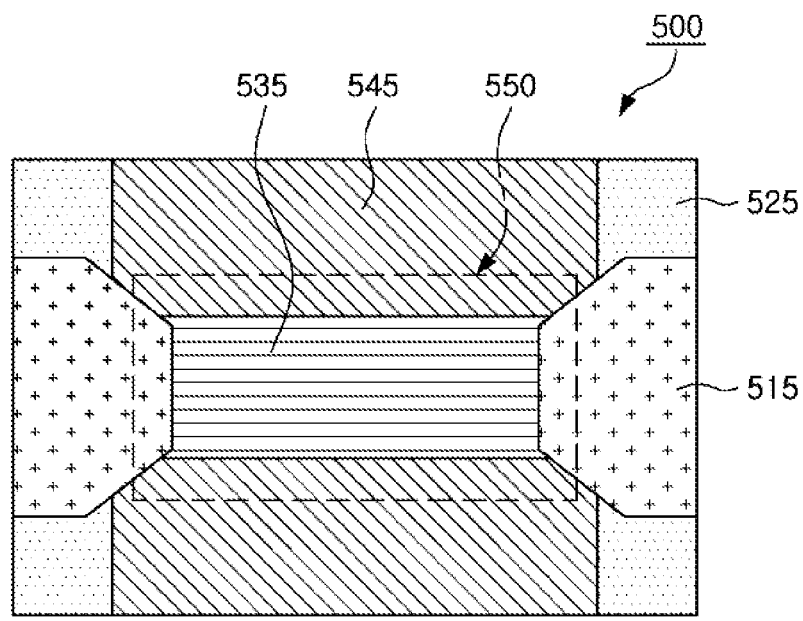
FIG. 8 is a plan view specifically illustrating a configuration of a magnetic field shielding unit of the package substrate illustrated in FIGS. 7A through 7D.

Referring to FIG. 7A, in which the first layer 510 is disposed in the uppermost portion of the package substrate, the first layer 510 may include the first base substrate 513. The first magnetic field shielding unit 515, a plurality of first and second circuit patterns 517a and 517b, a plurality of first pads 519a and 519b, and the like may be provided on the first base substrate 513. The first base substrate 513 may include an insulating layer or a metal layer, and the first magnetic field shielding unit 515 may include a ferromagnetic material, for example, iron (Fe), an iron-cobalt (Fe—Co) alloy, a nickel-iron (Ni—Fe) alloy, and the like.

The plurality of first circuit patterns 517a and 517b may include power source circuit patterns 517a transmitting a source voltage or a ground voltage, and signal circuit patterns 517b transmitting a control signal, a driving signal, and the like, with respect to the semiconductor device 200 mounted on the package substrate 500. The power source circuit patterns 517a transmitting a source voltage, a ground voltage, and the like, may have the area larger than that of the signal circuit patterns 517b and reduce loss of a source signal due to a resistance component.

The power source circuit patterns 517a provided on the first base substrate 513 and transmitting a source signal may have the area larger than that of the signal circuit patterns 517b and may have a mesh structure in which one or more empty spaces exist. In a case in which the power source circuit patterns 517a are formed as having a plate-like shape to reduce loss of a source signal by simply increasing the area of the power source circuit patterns 517a, photo solder resist PSR protecting the circuit patterns 517a and 517b may not be firmly attached, and thus, the power source circuit patterns 517a may be formed as having a mesh structure in order to improve reliability of attachment between the PSR and the circuit patterns 517a and 517b.

In the exemplary embodiment of the present disclosure, a portion of the power source circuit patterns 517a occupying a relatively large area on the first base substrate 513 may be replaced with the first magnetic field shielding unit 515, thus may block a magnetic field introduced to the semiconductor device 200 through the mounting region 550. In the case in which the first magnetic field shielding unit 515 is formed in a portion of the area occupied by the power source circuit patterns 517a, the power source circuit patterns 517a may be adjacent to the first magnetic field shielding unit 515.

The circuit patterns 517a and 517b may respectively be connected to at least one of first pads 519a and 519b. Among the plurality of first pads 519a and 519b included in the first layer 513, the first pads 519a disposed within the mounting region 550 may be electrically connected to an electrode provided in the semiconductor device 200 through a solder bump, a bonding wire or the like, within the mounting region 550.

The first pads 519a disposed within the mounting region 550 in which the semiconductor device 200 is disposed may be electrically connected to the other first pads 519b disposed outside of the mounting region 550 through the first circuit patterns 517a and 517b. The first pads 519b disposed outside of the mounting region 550 may be electrically connected to circuit patterns of the second to fourth layers 520, 530, and 540 stacked below the first layer 510 through vias provided within the first base substrate 513.

Figure 7B:
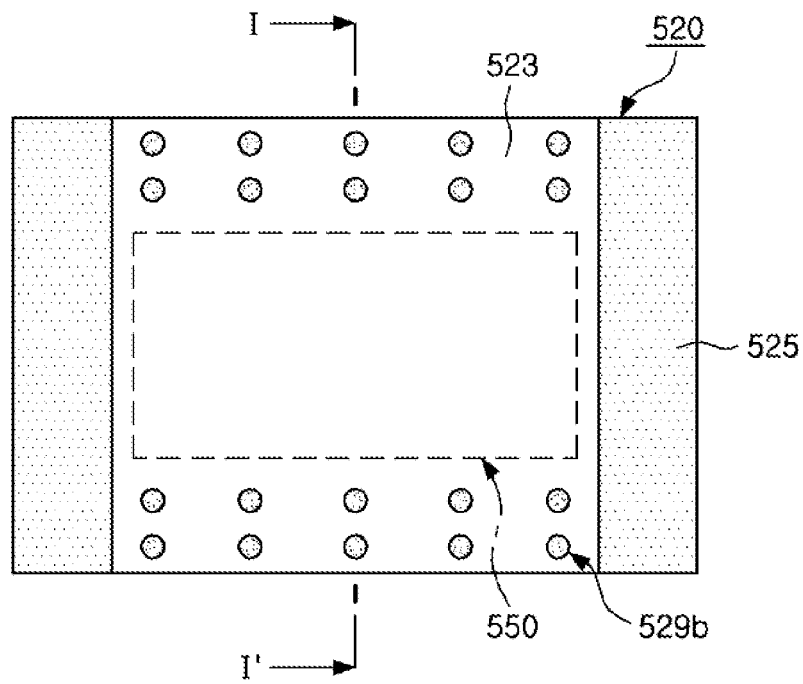

Referring to FIG. 7B, the second layer 520, stacked below the first layer 510, is illustrated. The second layer 520 may include the second base substrate 523, and a second magnetic field shielding unit 525, a plurality of second pads 529b, and the like, may be provided on the second base substrate 523. The plurality of second pads 529b provided on the second layer 520 may be electrically connected to a portion of the first pads 519b (or "a partial amount of the first pads 519b") disposed on the first layer 510 through vias provided in the first base substrate 513. Although not shown in FIG. 7B, a circuit pattern may be additionally provided on the second base substrate 523. Meanwhile, the third layer 530 may be disposed below the second layer 520.

Figure 7C:
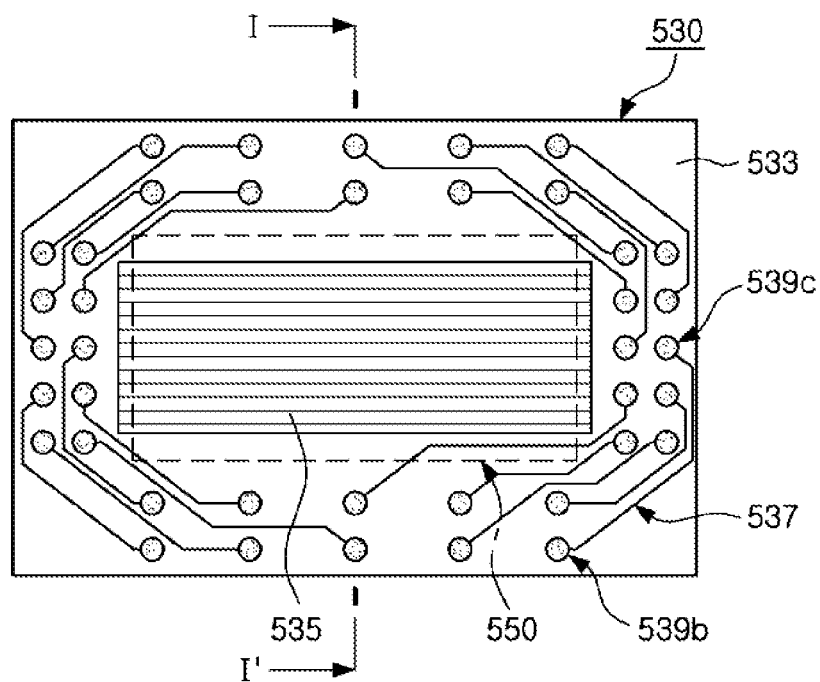

Referring to FIG. 7C, the third layer 530 may include the third base substrate 533, and the third magnetic field shielding unit 535, a plurality of third circuit patterns 537, and a plurality of third pads 539b and 539c may be disposed in the third base substrate 533. The third circuit patterns 537 provided on the third layer may be electrically connected to at least a portion of the plurality of third pads 539b and 539c. Among the plurality of third pads 539b and 539c, a portion of the third pads 539b disposed on upper and lower sides of the mounting region 550 may be electrically connected to the second pads 529b through vias provided within the second base substrate 523. Also, the third pads 539b disposed on the upper and lower sides of the mounting region 550 may be electrically connected to the portion of the third pads 539c disposed on the left and right sides of the mounting region 550 through the circuit patterns 537.

Figure 7D:
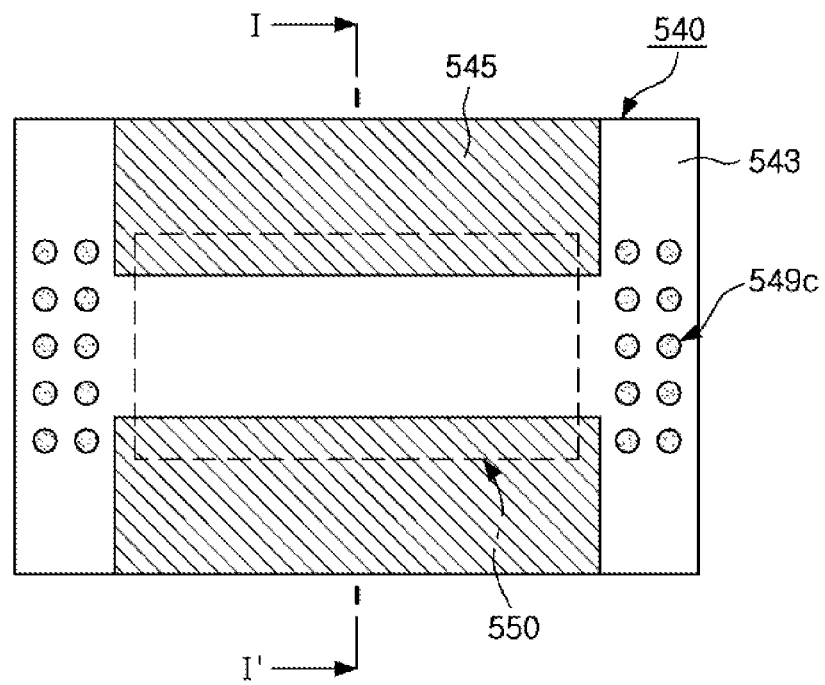

Referring to FIG. 7D, the fourth layer 540 may include a fourth base substrate 543, and a fourth magnetic field shielding unit 545, a plurality of fourth pads 549c, and the like, may be disposed on the fourth base substrate 543. The plurality of fourth pads 549c provided in the fourth layer 540 may be electrically connected to the portion of the third pads 539c disposed on the left and right sides of the mounting region 550 in the third layer 530 through vias formed within the third base substrate 533.

Referring to FIG. 8, a configuration of magnetic field shielding units 515, 525, 535, and 545 viewed from the top of a package substrate 500 including the first to fourth layers 510, 520, 530, and 540 illustrated in FIGS. 7A through 7D. The base substrates 513, 523, 533, and 543 included in the first to fourth layers 510, 520, 530, and 540 may be stacked to constitute a body unit of the package substrate 500.

The magnetic field shielding units 515, 525, 535, and 545 respectively provided in the layers 510, 520, 530, and 540 may include at least portions overlapping with each other on a plane of the package substrate 500. In the present exemplary embodiment, a magnetic field shielding region defined by the plurality of magnetic field shielding units 515, 525, 535, and 545 is illustrated as having the area greater than that of the mounting region 550 and has the area substantially equal to that of the plane of the package substrate 500, but the present disclosure is not limited thereto.

Figure 9:
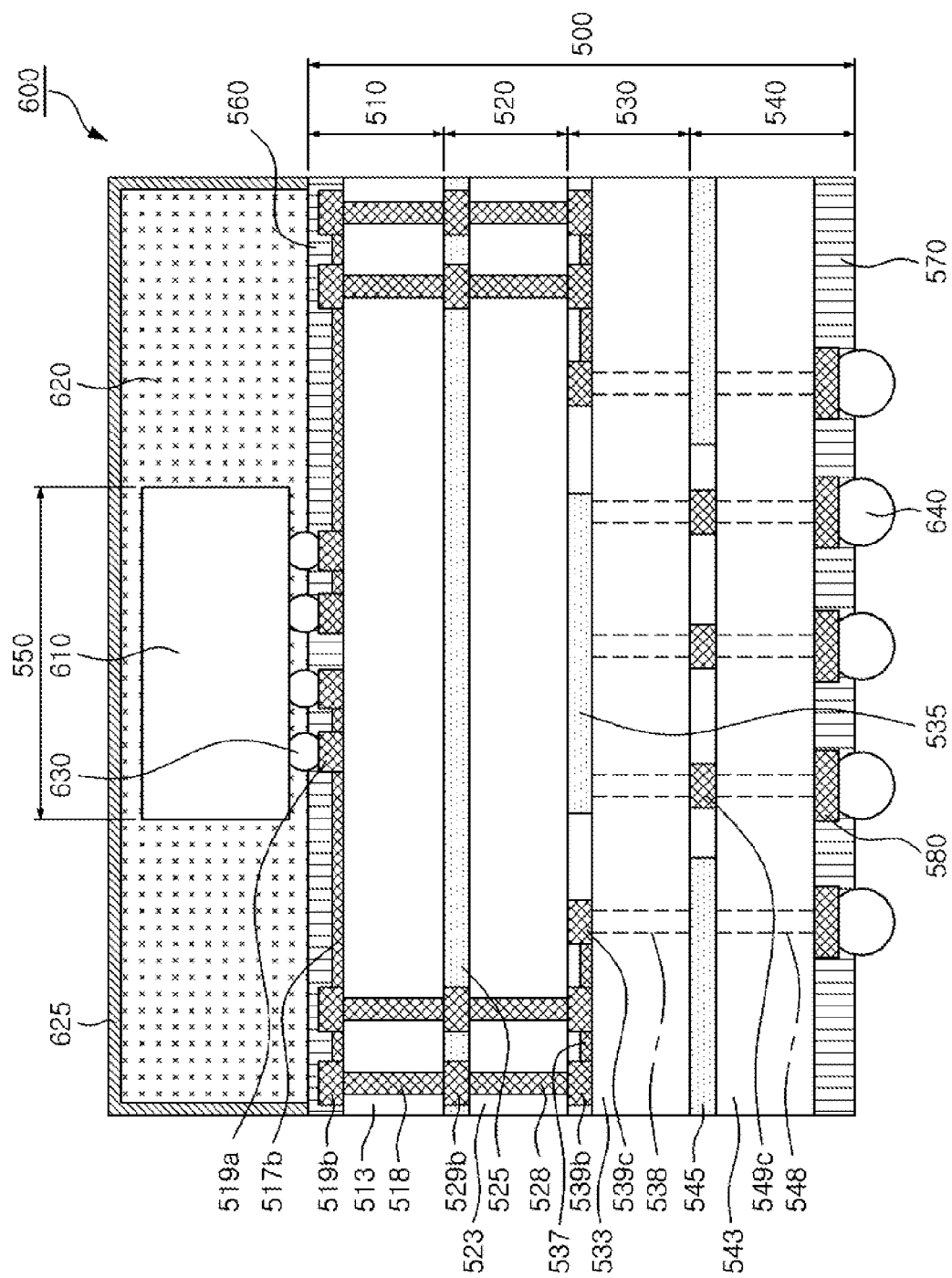
FIG. 9 is a cross-sectional view of the magnetic field shielding unit of the package substrate illustrated in FIGS. 7A through 7D taken along line I-I'.

FIG. 9 is a cross-sectional view of the magnetic field shielding unit of the package substrate illustrated in FIGS. 7A through 7D taken along line I-I'.

Referring to FIG. 9, a semiconductor package 600 including the package substrate 500 described above with reference to FIGS. 7A through 7D and 8 is illustrated. The package substrate 500 includes a plurality of layers 510, 520, 530, and 540, and an upper protective layer 560 for protecting the first pads 519a and 519b and the first circuit patterns 517b may be provided on the first base substrate 513 of the first layer 510. Among the first pads 519a and 519b provided on the first base substrate 513, a portion of the first pads 519a (or a partial amount of first pads 519a) may be connected to an electrode of the semiconductor device 610 through a solder bump 630, a bonding wire or the like.

In FIG. 9, it is assumed that the semiconductor device 610 is connected to the package substrate 500 in a flipchip manner, but the present disclosure is not limited thereto and electrodes of the semiconductor device 610 and the first pads 519a of the package substrate 500 may be connected through a wire, or the like. Also, a portion of the electrodes of the semiconductor device 610 may be connected to the first pads 619a of the package substrate 500 through solder bumps 630, or the like, and the other remaining electrode may be connected through a wire.

A molding material 620 may be applied to the semiconductor device 610, and a housing 625 blocking a magnetic field may be provided on the molding material 620. The housing 625 may shield a magnetic field introduced from an upper side, a lateral side, and the like, excluding a lower side of the semiconductor device 610 connected to the package substrate 500. Magnetic fields that may be transmitted to the semiconductor device 610 may be blocked substantially in all directions by means of the magnetic field shielding units 515, 525, 535, and 545 and the housing 625 provided on the molding material 620.

The package substrate 500 may include a body unit provided by the base substrates 513, 523, 533, and 543 respectively included in the plurality of layers 510, 520, 530, and 540 and magnetic field shielding units 515, 525, 535, and 545 respectively provided on the base substrates 513, 523, 533, and 543. The magnetic field shielding units 515, 525, 535, and 545 may be disposed in different positions on the plane of the body unit of the package substrate 500 providing the mounting region 550 and may include at least portions overlapping with each other. The magnetic field shielding region defined by the magnetic field shielding units 515, 525, 535, and 545 may have the area greater than or equal to that of the mounting region 550 in which the semiconductor device 610 and the package substrate 500 are connected.

The first layer 510 includes the first base substrate 513, and a first magnetic field shielding unit 515, first circuit patterns 517a and 517b, and first pads 519a and 519b, and the like, may be provided on the first base substrate 513. The first magnetic field shielding unit 515 and a portion of the first circuit patterns 517a (or partial first circuit patterns 517a) may not be shown in FIG. 9 illustrating a cross-section taken along line I-I'. The partial amount of first pads 519a included in the mounting region 550 and the partial amount of first pads 519b provided outside of the mounting region 550 may be electrically connected by the partial first circuit patterns 517b illustrated in FIG. 9.

The partial amount of first pads 519b provided outside of the mounting region 550 may be electrically connected to the second pads 529b included in the second layer 520 through the first vias 518 provided within the first base substrate 513. The second layer 520 may include the second base substrate 523, the second magnetic field shielding unit 525 provided on the second base substrate 523, a plurality of second pads 529b, and the like. Second vias 528 may be provided within the second base substrate 523, and the second pads 529b included in the second layer 520 and the third pads 539b included in the third layer 530 may be electrically connected through the second vias 528. Meanwhile, the second magnetic field shielding unit 525 may have a portion overlapping with the first magnetic field shielding unit 515 and may be formed in a region different from that of the first magnetic field shielding unit 515.

The third layer 530 may include a third base substrate 533, a third magnetic field shielding unit 535 provided on the third base substrate 533, third circuit patterns 537, and third pads 539b and 539c, and the like. A portion of the third pads 539b (or partial third pads 539b) may be electrically connected to the second pads 529b included in the second layer 520 through second vias 528 provided within the second base substrate 523. The partial third pads 539b may be electrically connected to the other third pads 539c through the third circuit patterns 537. The other third pads 539c may be electrically connected to fourth pads 549c included in the fourth layer 540 through third vias 538 provided within the third base substrate 530.

The fourth layer 540 may include a fourth base substrate 543, a fourth magnetic field shielding unit 545 provided on the fourth base substrate 543, fourth pads 549c, and the like. Also, a plurality of fifth pads 580 electrically connecting the semiconductor package 600 to an external device, a protective layer 570 protecting the fifth pads 580, solder bumps 640 connecting the fifth pads 580 to an electrode, pad, or the like, of an external device, and the like, may be provided on a lower surface of the fourth layer 540. The fourth pads 549c provided on an upper surface of the fourth base substrate 543 and the fifth pads 580 provided on the lower surface of the fourth base substrate 543 may be electrically connected through fourth vias 548 provided within the fourth base substrate 543.

In the exemplary embodiment illustrated in FIG. 9, magnetic field shielding units 515, 525, 535, and 545 respectively included in the layers 510, 520, 530, and 540 may include a ferromagnetic material, for example, iron (Fe), an iron-cobalt (Fe—Co) alloy, a nickel-iron (Ni—Fe) alloy, and the like. In case of an alloy, the magnetic field shielding units 515, 525, 535, and 545 may include Permalloy. Also, the magnetic field shielding units 515, 525, 535, and 545 may be formed in different positions on the plane of the package substrate 500 and include at least partially overlapping regions. A magnetic field shielding region defined by the magnetic field shielding units 515, 525, 535, and 545 may have the area greater than or equal to that of the mounting region 550.

If the package substrate 500 does not include the magnetic field shielding units 515, 525, 535, and 545, a magnetic field introduced from a lower side of the package substrate 500 may be transmitted to the semiconductor device 610. However, as illustrated in the exemplary embodiment illustrated in FIG. 9, the magnetic field shielding units 515, 525, 535, and 545 are provided within the package substrate 500 and the layers 510, 520, 530, and 540 included in the package substrate 500 are designed such that vias are formed not to be connected straight from the first layer 510 to the fourth layer 540 of the package substrate 500, whereby a magnetic field introduced from a lower side of the package substrate 500 may be prevented from being transmitted to the semiconductor device 610. In order to prevent vias from being connected linearly straight from the first layer 510 to the fourth layer 540, the magnetic field shielding units 515, 525, 535, and 545 may be provided in different positions on the plane of the package substrate 500 and may include at least partially overlapping regions.

Meanwhile, in the exemplary embodiment described above with reference to FIGS. 7A through 7D, 8, and 9, the magnetic field shielding units 515, 525, 535, and 545 may be connected to a predetermined constant voltage source. Here, the magnetic field shielding units 515, 525, 535, and 545 may serve to shield electrical noise, as well as a magnetic field transmitted from the outside. A predetermined insulating material may be disposed in regions of the base substrates 513, 523, 533, and 543, other than the regions thereof in which the magnetic field shielding units 515, 525, 535, and 545, the circuit patterns 517a, 517b, and 537, the plurality of pads 519a, 519b, 529b, 539b, and 549c, and the like, are not formed.

FIGS. 10A through 10D are plan views schematically illustrating a package substrate according to an exemplary embodiment of the present disclosure.

In FIGS. 10A through 10D, a total of four layers 710, 720, 730, and 740 that may be included in a package substrate are illustrated, and base substrates 713, 723, 733, and 743 respectively included in the layers 710, 720, 730, and 740 may be stacked to provide a body unit of a single package substrate. At least partial regions of magnetic field shielding units 725a, 725b, 735, and 745 formed on base substrates 723, 733, and 743 respectively included in some layers 720, 730, and 740 may overlap with each other on the plane illustrated in FIGS. 10A through 10D to define a magnetic field shielding region. The magnetic field shielding region defined by the magnetic field shielding units 725a, 725b, 735, and 745 may have the area greater than or equal to that of a mounting region 750.

Figure 10A:
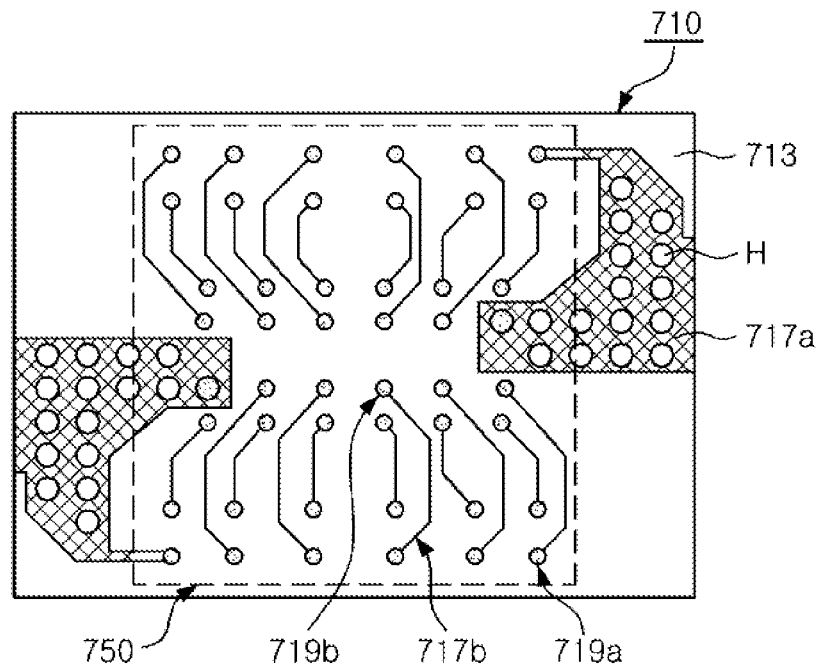
FIGS. 10A through 10D are plan views schematically illustrating a package substrate according to an exemplary embodiment of the present disclosure.

Referring to FIG. 10A illustrating the first layer 710 disposed in the uppermost portion of the package board, the first layer 710 may include a first base substrate 713, a plurality of first circuit patterns 717a and 717b, and a plurality of first pads 719a and 719b. The first base substrate 713 may include an insulating layer or a metal layer, and the plurality of first circuit patterns 717a and 717b may include power source circuit patterns 717a transmitting a source voltage and a ground voltage and signal circuit patterns 717b transmitting a control signal, a driving signal, and the like, with respect to a semiconductor device mounted on the package substrate. The power source circuit patterns 717a transmitting a source voltage, a ground voltage, and the like, may have the area greater than that of the signal circuit patterns 717b, and thus, loss of a source voltage due to a resistance component may be reduced.

As illustrated in FIG. 10A, the power source circuit patterns 717a may have a mesh structure having a plurality of empty spaces. By forming the power source circuit patterns 717a to have the mesh structure, loss of a source signal may be reduced and a protective layer, for example, a photo solder resist (PSR) layer, provided on an upper surface of the first layer 710, may be firmly attached to the first layer 710.

Meanwhile, in the present exemplary embodiment, the first layer 710 may not include a magnetic field shielding unit. In the present exemplary embodiment, a magnetic field shielding region may be defined by the magnetic field shielding units 725a, 725b, 735, and 745 respectively formed in the second to fourth layers 720, 730, and 740, and here, a magnetic field shielding region having the area greater than or equal to that of the mounting region 750 may be formed only with the magnetic field shielding units 725a, 725b, 735, and 745 respectively formed in the second to fourth layers 720, 730, and 740.

The first circuit patterns 717a and 717b may be electrically connected to at least one first pad 719a or 719b. Among the plurality of first pads 719a and 719b included in the first layer 713, the first pads 719a disposed to be adjacent to the boundary of the mounting region 750 may be electrically connected to electrodes provided in the semiconductor device through solder bumps, or the like. Also, the first pads 719a may be electrically connected to the other first pads 719b through the first circuit patterns 717a and 717b. The other first pads 719b may be electrically connected to the circuit patterns of the second to fourth layers 720, 730, and 740 stacked under the first layer 710 through vias provided in the first base substrate 713.

Figure 10B:
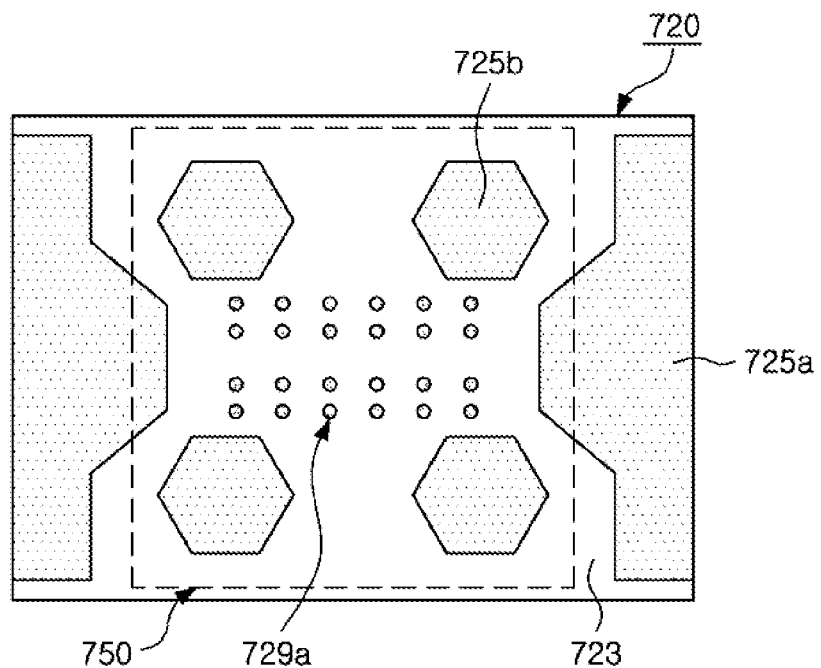

Referring to FIG. 10B, the second layer 720 stacked under the first layer 710 is illustrated. The second layer 720 may include a second base substrate 723, first and second magnetic field shielding units 725a ad 725b provided on the second base substrate 723, a plurality of second pads 729b, and the like. The plurality of second pads 729b provided in the second layer 720 may be electrically connected to a partial amount of first pads 719b disposed in the first layer 710 through vias provided within the first base substrate 713. If necessary, an additional circuit pattern may be further provided on the second base substrate 723.

In FIG. 10B, the first and second magnetic field shielding units 725a and 725b having different shapes and areas may be provided on the second base substrate 723. The first magnetic field shielding unit 725a may be disposed to be adjacent to the edge of the second base substrate 723, and the second magnetic field shielding unit 725b may be provided in a position corresponding to the partial amount of first pads 719a connected to the semiconductor device in the first layer 710. By forming the second magnetic field shielding unit 725b in a position corresponding to the partial amount of first pads 719a, a magnetic field that may be transmitted to the semiconductor device through the partial amount of first pads 719a may be effectively blocked.

Figure 10C:
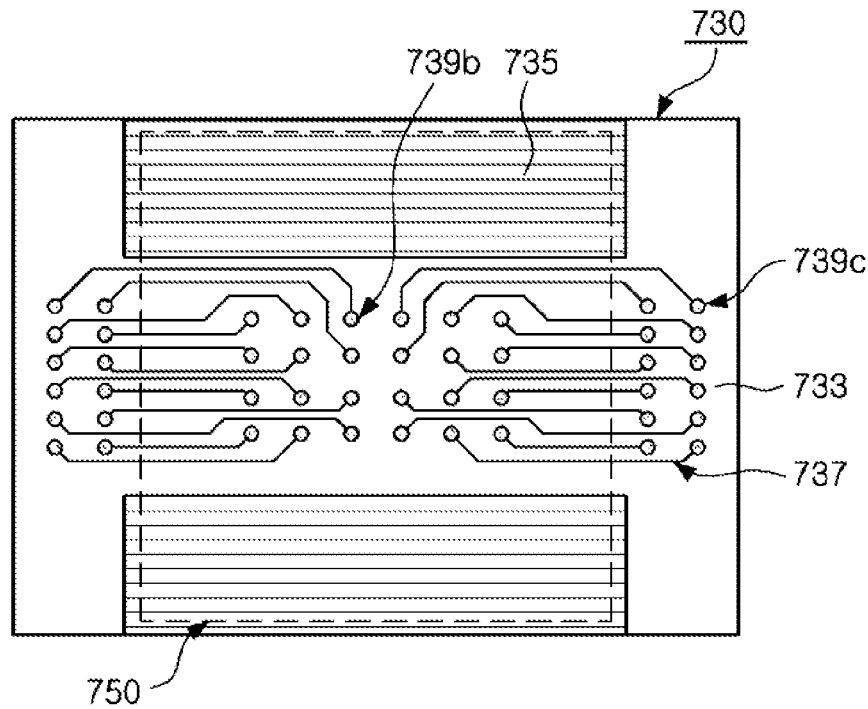

Referring to FIG. 10C, the third layer 730 may include a third base substrate 733, a third magnetic field shielding unit 735 provided on the third base substrate 733, a plurality of third circuit patterns 737, and a plurality of third pads 739b and 739c. The third circuit patterns 737 provided on the third layer 730 may electrically connect at least a portion of the plurality of third pads 739b and 739c. Among the plurality of third pads 739b and 739c, partial third pads 739b disposed within a mounting region 750 may be electrically connected to the second pads 729b through vias provided within the second base substrate 723. Also, the third pads 739b disposed outside of the mounting region 750 may be electrically connected to the third pads 739c disposed within the mounting region 750 through the circuit patterns 737.

Figure 10D:
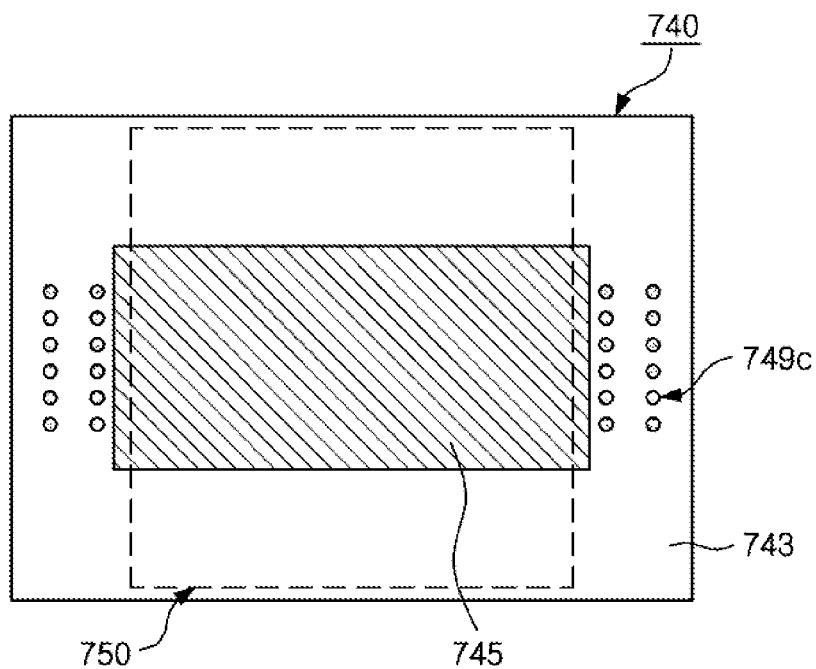

Referring to FIG. 10D, the fourth layer 740 may include a fourth base substrate 743, a fourth magnetic field shielding unit 745 provided on the fourth base substrate 743, and a plurality of fourth pads 749c. The plurality of fourth pads 749c provided on the first layer 740 may be electrically connected to the partial third pads 739c of the third layer 730 through vias formed within the third base substrate 733.

Figure 11:
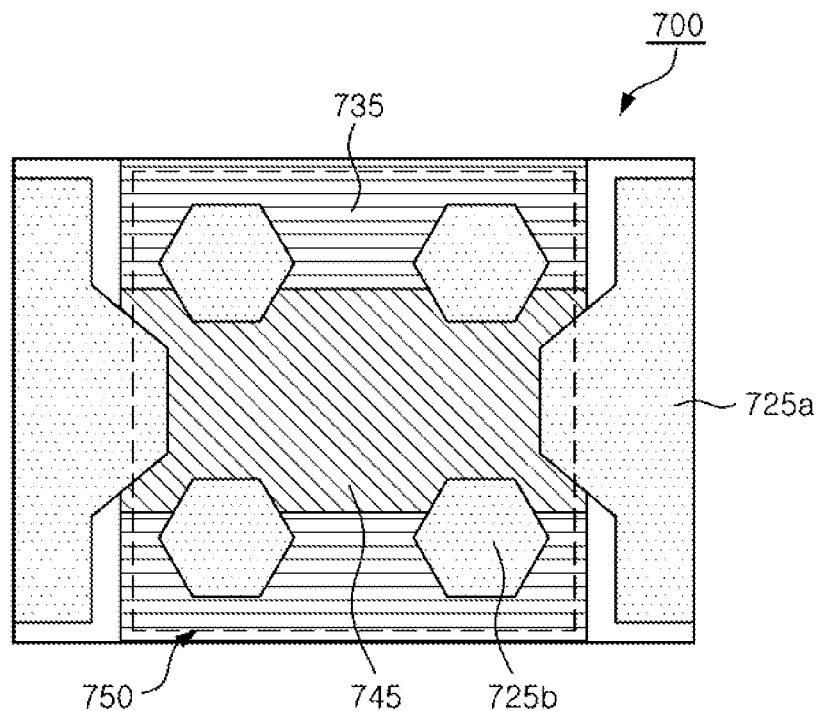
FIG. 11 is a plan view schematically illustrating a configuration of the magnetic field shielding unit of the package substrate illustrated in FIGS. 10A through 10D.

FIG. 11 is a plan view schematically illustrating a configuration of the magnetic field shielding unit of the package substrate illustrated in FIGS. 10A through 10D.

Referring to FIG. 11, in a package substrate 700 including first to fourth layers 710, 720, 730, and 740 illustrated in FIGS. 10A through 10D, a configuration of the magnetic field shielding units 725a, 725b, 735, and 745 viewed from the above is illustrated. Base substrates 713, 723, 733, and 743 respectively included in the layers 710, 720, 730, and 740 may be stacked to provide a body unit.

In the present exemplary embodiment, magnetic field shielding units 725a, 725b, 735, and 745 provided on portions of the base substrates 723, 733, and 743 may include at least portions overlapping with each other on the plane of the package substrate 700. In the present exemplary embodiment, a magnetic field shielding region defined by the plurality of magnetic field shielding units 725a, 725b, 735, and 745 may have the area greater than that of the mounting region 750. Also, the magnetic field shielding region may overlap with all of the circuit patterns 717a, 717b, and 737, and pads 719a, 719b, 729a, 739b, 739c, and 749c.

FIGS. 12A through 12D are plan views schematically illustrating a package substrate according to an exemplary embodiment of the present disclosure.

In FIGS. 12A through 12D, four layers 810, 820, 830, and 840 that may be included in a package substrate are illustrated, and the layers 810, 820, 830, and 840 may be stacked to form a single package substrate. The layers 810, 820, 830, and 840 may respectively include base substrates 813, 823, 833, and 843, and the stacked body of the base substrates 813, 823, 833, and 843 may be provided as a body unit of the single package.

Meanwhile, at least partial regions of the magnetic field shielding units 825, 835 and 845 respectively included in the at least partial layers 820, 830, and 840 may overlap with each other on the plane illustrated in FIGS. 12A through 12D to define a magnetic field shielding region. The magnetic field shielding region defined by the magnetic field shielding units 825, 835, and 845 may have the area greater than or equal to that of a mounting region 850.

Figure 12A:
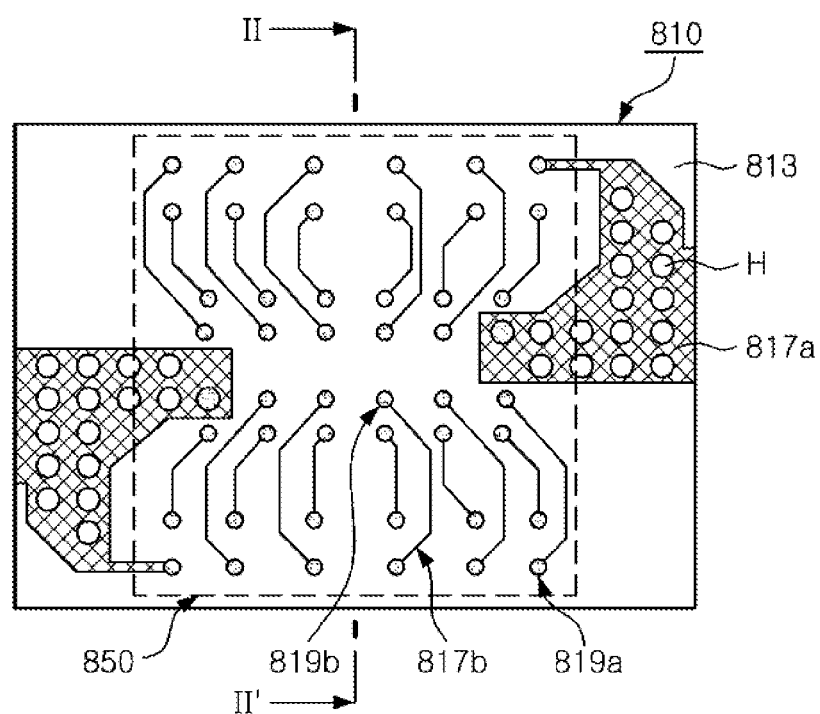
FIGS. 12A through 12D are plan views schematically illustrating a package substrate according to an exemplary embodiment of the present disclosure.

Referring to FIG. 12A illustrating the first layer 810 disposed in the uppermost portion of the package board, the first layer 810 of the package substrate may have a shape similar to that of the first layer 710 of the package substrate illustrated in FIG. 10A. Namely, the first layer 810 of FIG. 12A may include a first base substrate 813, a plurality of first circuit patterns 817a and 817b, and a plurality of first pads 819a and 819b. The first base substrate 813 may include an insulating layer or a metal layer, and the plurality of first circuit patterns 817a and 817b may include power source circuit patterns 817a transmitting a source voltage and a ground voltage and signal circuit patterns 817b transmitting a control signal, a driving signal, and the like, with respect to a semiconductor device mounted on the package substrate. Like the power source circuit patterns 717a in the exemplary embodiment of FIG. 10A, the power source circuit patterns 817a transmitting a source voltage, a ground voltage, and the like, may have the area greater than that of the signal circuit patterns 817b, and thus, loss of a source voltage may be reduced.

Figure 12B:
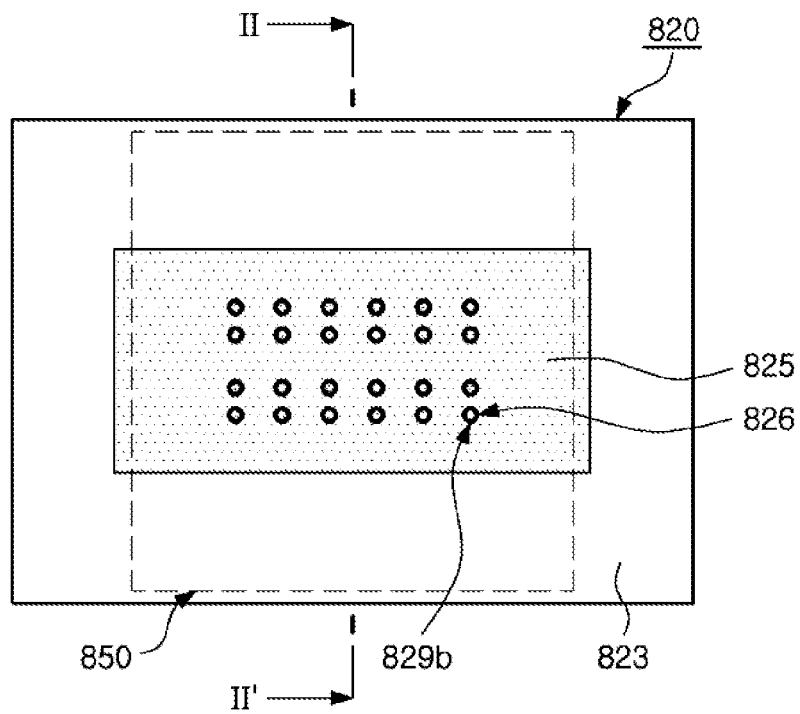

Referring to FIG. 12B, the second layer 820 disposed below the first layer 810 may include a second base substrate 823 and a first magnetic field shielding unit 825 provided on the second base substrate 823. In particular, the first magnetic field shielding unit 825 may have a plurality of via holes 826 formed in positions corresponding to partial first pad 819b among the plurality of first pads 819a and 819b formed on the first layer 810. Second pads 829b formed of a conductive material may be provided within the via holes 826 and electrically separated from the first magnetic field shielding unit 825. In order to electrically separate the second pads 829b and the first magnetic field shielding unit 825, the second pads 829b may be spaced apart from the via holes 826 by a predetermined distance such that the second pads 829b are not in contact with inner diameters of the via holes 826, or a predetermined insulating material may be disposed between the second vias 829b and the via holes 826.

Figure 12C:
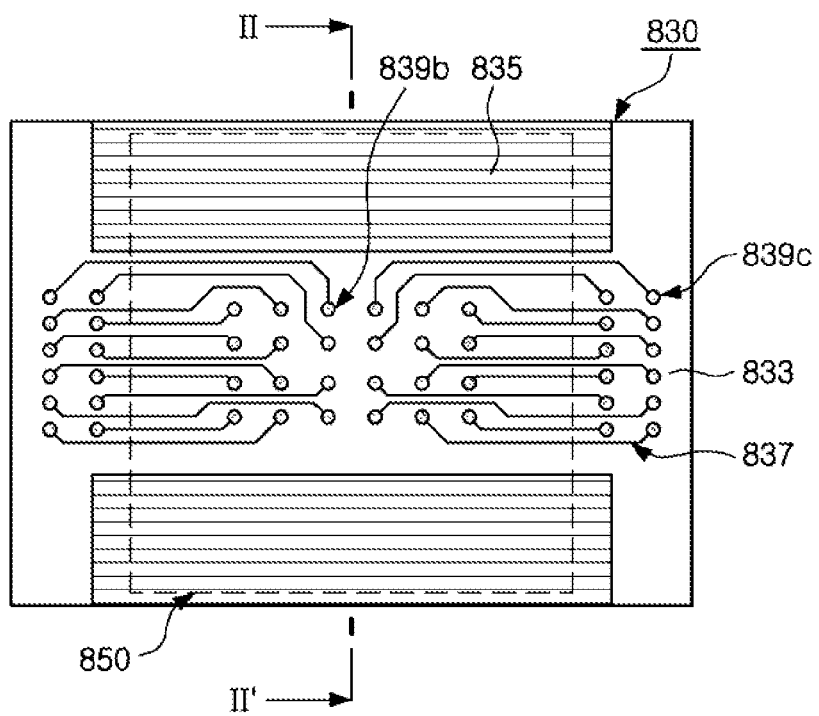

Referring to FIG. 12C, the third layer 830 stacked below the second layer 820 may include a third base substrate 833, a second magnetic field shielding unit 835, a plurality of circuit patterns 837, a plurality of third pads 839b and 839c, and the like. The second magnetic field shielding unit 835, the plurality of circuit patterns 837, and the plurality of third pads 839b and 839c may be disposed on the third base substrate 833.

Among the plurality of third pads 839b and 839c, partial third pads 839b disposed within the mounting region 850 may be connected to the second pads 829b through vias provided within the second base substrate 823. Also, the partial third pads 839b may be electrically connected to the other third pads 839c disposed outside of the mounting region 850 through the circuit patterns 837. In the third layer 830, the second magnetic field shielding unit 835 may shield at least a portion of the mounting region 850.

Figure 12D:
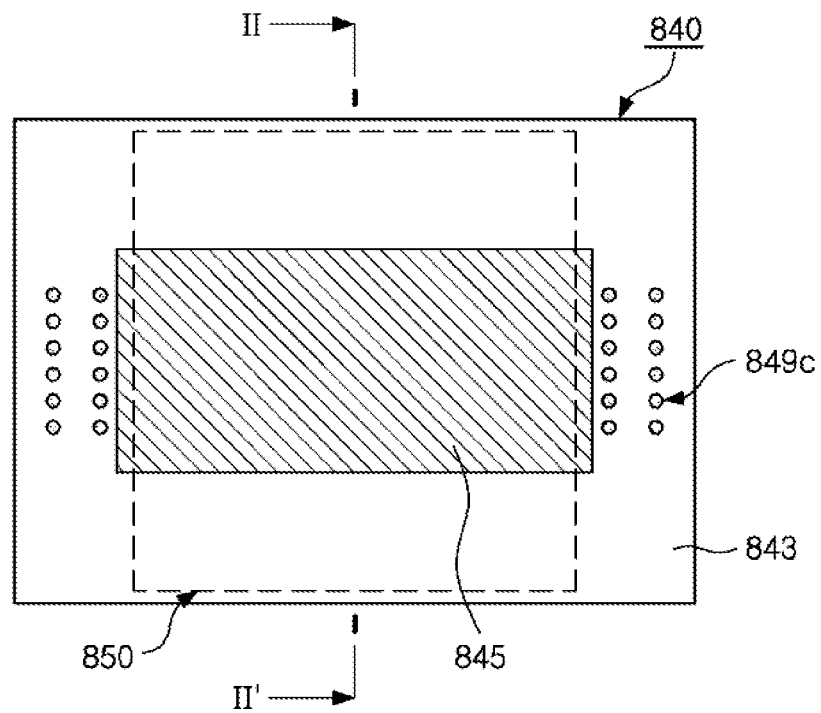

The fourth layer 840 illustrated in FIG. 12D may be disposed below the third layer 830 and may include a fourth base substrate 843, a third magnetic field shielding unit 845, and a plurality of fourth pads 849c. The plurality of fourth pads 849c may be electrically connected to the third pads 839c provided on the third layer 830 through a plurality of vias provided within the third base substrate 833.

The third magnetic field shielding unit 845 provided on the fourth layer 840 may overlap with the entirety of the plurality of via holes 826 provided in the first magnetic field shielding unit 825. In the present exemplary embodiment, it is illustrated that the third magnetic field shielding unit 845 has a shape and the area similar to those of the first magnetic field shielding unit 825 in a position substantially identical to that of the first magnetic field shielding unit 825, but, unlike the first magnetic field shielding unit 825, the third magnetic field shielding unit 845 does not include via holes. The third magnetic field shielding unit 845 is formed to overlap the entirety of the plurality of via holes 826 provided in the first magnetic field shielding unit 825, and thus, vias linearly connected straight from the first layer 810 to the fourth layer 840 are not formed and a magnetic field may be prevented from being introduced to the semiconductor device through the via holes 826 provided in the first magnetic field shielding unit 825.

Figure 13A:
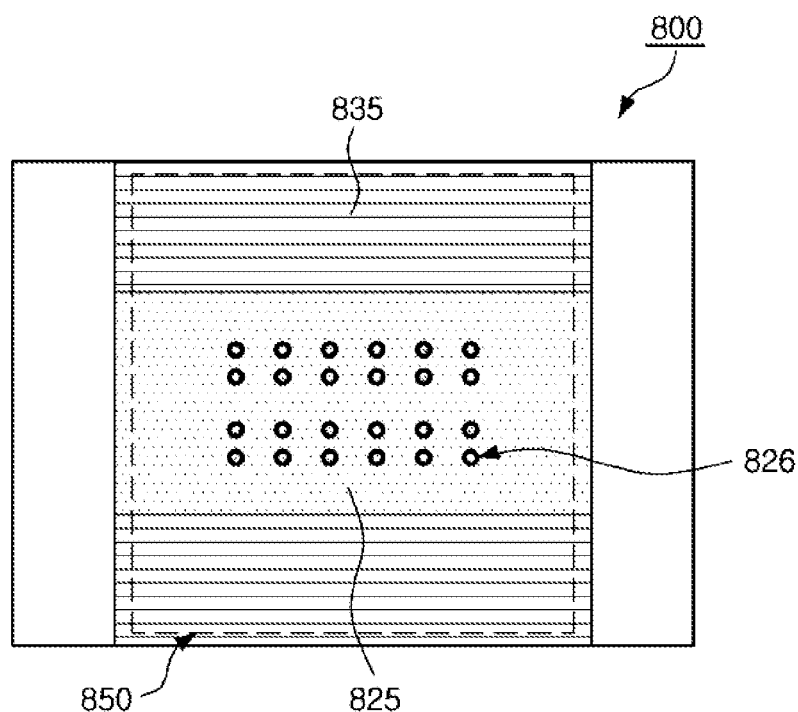
FIGS. 13A and 13B are plan views specifically illustrating a configuration of the magnetic field shielding unit of the package substrate illustrated in FIGS. 12A through 12D.
Figure 13B:
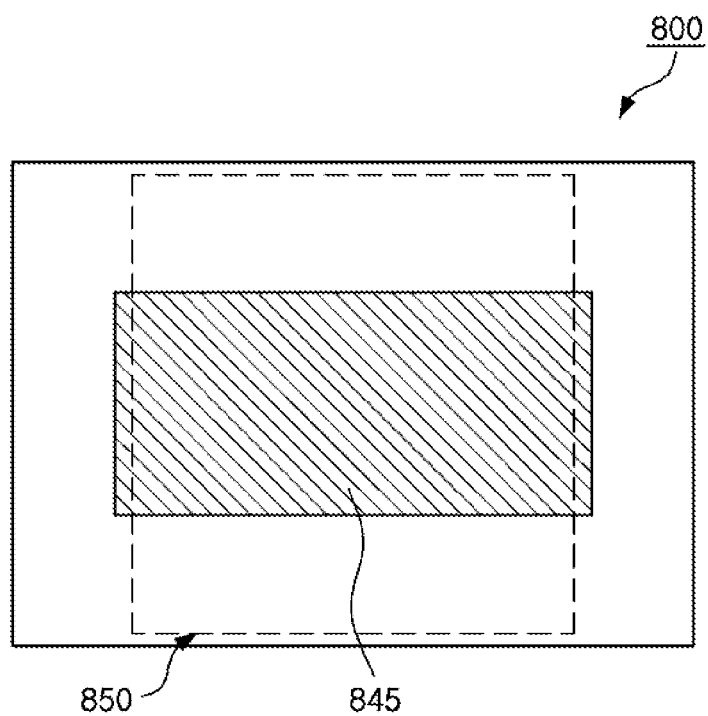

FIGS. 13A and 13B are plan views specifically illustrating a configuration of the magnetic field shielding unit of the package substrate illustrated in FIGS. 12A through 12D. Specifically, FIG. 13A is a plan view schematically illustrating the overlapping second layer 820 and third layer 830 in the package substrate 800, and FIG.

13B is a plan view schematically illustrating the fourth layer 840 of the package substrate 800.

First, referring to FIG. 13A, the mounting region 850 may be shielded from a magnetic field introduced from the outside by means of the first magnetic field shielding unit 825 and the second magnetic field shielding unit 835. However, since the first magnetic field shielding unit 825 may include a plurality of via holes 826 formed therein, a magnetic field may be introduced through the via holes 826 of the first magnetic field shielding unit 825 and resultantly transmitted even to the semiconductor device mounted on the package substrate 800.

A magnetic field that may be introduced through the via holes 826 may be blocked by the third magnetic field shielding unit 845 provided on the fourth layer 840. As described above, the third magnetic field shielding unit 845 may be formed to overlap with the entirety of the plurality of via holes 826. When a partial plan view of the package substrate 800 illustrated in FIG. 13A and a partial plan view of the package substrate 800 illustrated in FIG. 13B are overlapped, the entirety of the plurality of via holes 826 illustrated in FIG. 13A may overlap with the third magnetic field shielding unit 845 illustrated in FIG. 13B. Accordingly, a magnetic introduced from the outside may be prevented from reaching even the semiconductor device in the package substrate 800 overall.

Figure 14:
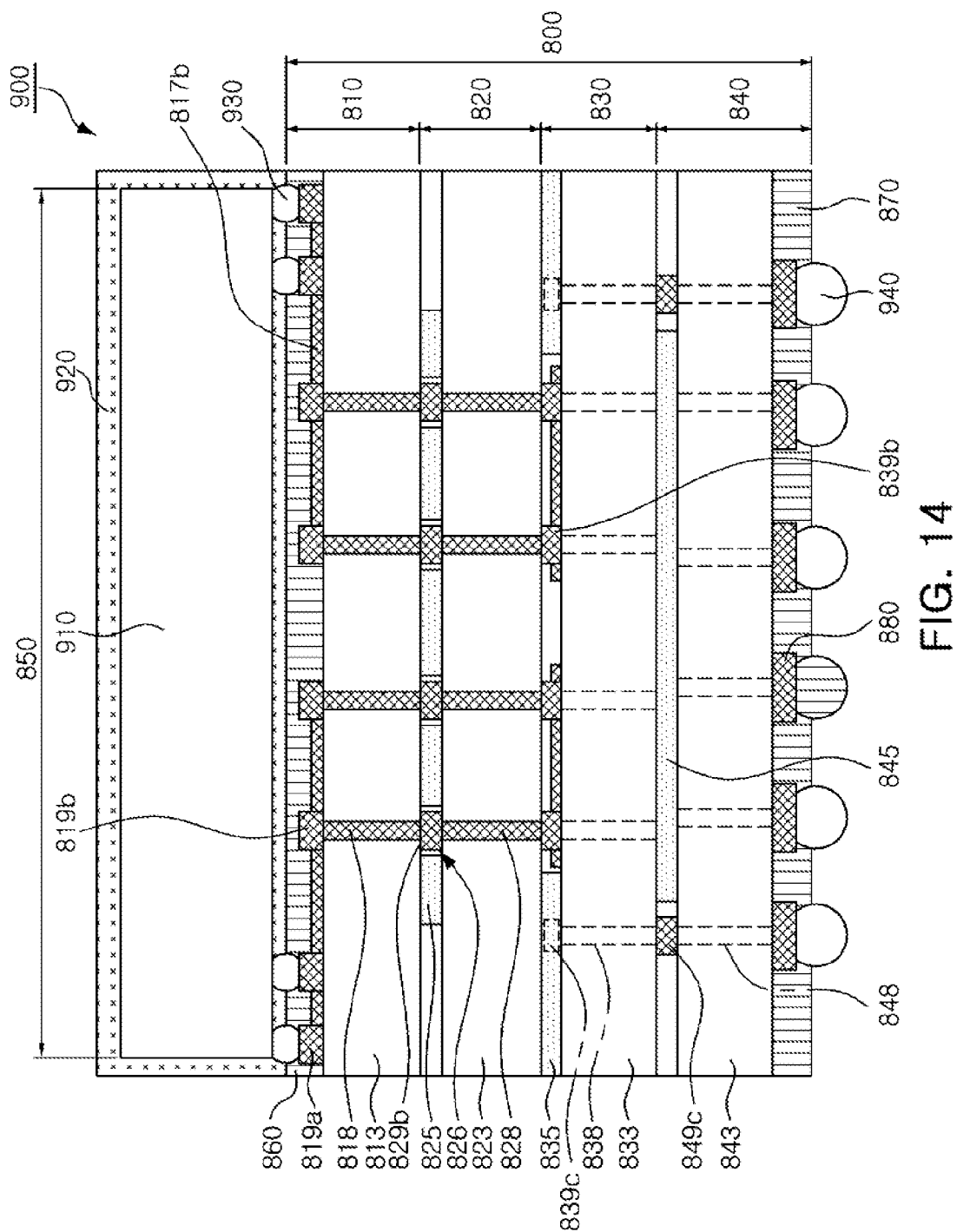
FIG. 14 is a cross-sectional view of the magnetic field shielding unit of the package substrate illustrated in FIGS. 12A through 12D taken along line II-II'.

FIG. 14 is a cross-sectional view of the magnetic field shielding unit of the package substrate illustrated in FIGS. 12A through 12D taken along line II-II'.

Referring to FIG. 14, a semiconductor package 900 including the package substrate 800 described above with reference to FIGS. 12A through 12D and 8 is illustrated. The package substrate 800 according to the present exemplary embodiment may include a body unit provided by the base substrates 813, 823, 833, and 843 respectively included in the layers 810, 820, 830, and 840, magnetic field shielding units 825, 835, and 845 respectively provided on partial base substrates 823, 833, and 843, and the like.

A protective layer 860 may be provided on the first layer 810 positioned in the uppermost portion of the package substrate 800 in the stacked direction to protect the first pads 819a and 819b and the first circuit patterns 817a and 817b. Among the first pads 819a and 819b provided on the first layer 810, the partial amount of first pads 819a adjacent to the edge of the mounting region 850 may be connected to electrodes of a semiconductor device 910 through solder bumps 930, and the like.

In FIG. 14, it is assumed that the semiconductor device 910 is connected to the package substrate 800 in a flipchip manner, but the present disclosure is not limited thereto and the semiconductor device 910 may be mounted on the package substrate 800 through a wire, or the like.

Alternatively, partial electrodes of the semiconductor device 910 may be connected to the first pads 819a of the package substrate 800 through solder bumps 930, or the like, while the other remaining electrodes may be connected through wires. Meanwhile, a molding material 920 may be applied to the semiconductor device 910 to protect the semiconductor device 910.

The package substrate 800 may include a plurality of stacked layers 810, 820, 830, and 840, and the magnetic field shielding units 825, 835, and 845 may be formed in at least partial layers 820, 830, and 840. The magnetic field shielding units 825, 835, and 845 may be formed in different positions on the plane of the package substrate 800, and may include at least partial overlapping regions. A magnetic field shielding region defined by the magnetic field shielding units 825, 835, and 845 may have the area greater than or equal to that of the mounting region 850 in which the semiconductor device 910 and the package substrate 800 are connected.

The first layer 810 may include the first base substrate 813, the first circuit patterns 817a and 817b and the first pads 819a and 819b provided on the first base substrate 813, and the like. Partial circuit patterns 817a and 817b and the first pads 819a and 819b may not shown in FIG. 14 illustrating a cross-section taken along line II-II'. A partial amount of first pads 819a adjacent to the edge of the mounting region 850 and the other first pads 819b disposed to be spaced apart from the edge of the mounting region 850 may be electrically connected by the circuit patterns 817b.

The partial amount of first pads 819b may be electrically connected to the second pads 829b included in the second layer 920 through the first vias provided within the first base substrate 813. The second layer 820 may include the second base substrate 823, the first magnetic field shielding unit 826 and the plurality of second pads 829b provided on the second base substrate 823, and the like. The second vias 828 are provided within the second base substrate 823, and the second pads 829b included in the second layer 820 and the third pads 839b included in the third layer 830 may be electrically connected through the vias 828.

In the present exemplary embodiment, a plurality of via holes 826 may be provided within the first magnetic field shielding unit 825 provided on the second base substrate 823. A plurality of second pads 829b may be positioned within the via holes 826 such that the second pads 829b are electrically separated from the first magnetic field shielding unit 825, and the plurality of second pads 829b may be electrically connected to the first vias 818a and the second vias 828 in a vertical direction. In FIG. 14, it is illustrated that the second pads 819b and the via holes 826 are physically separated, but an insulating material may be provided between the second pads 829b and the via holes 826 to electrically separate the second pads 829b and the via holes 826.

The third layer 830 may include the third base substrate 833, the second magnetic field shielding unit 835 and the third pads 839b provided on the third base substrate 822, and the like. Partial third pads 839b may be electrically connected to the second pads 829b included in the second layer 820 through the second vias 828 provided within the second base substrate 823. The third pads 839c, other than the partial third pads 839b, may be electrically connected to the partial third pads 8 39b through the third circuit patterns 837. The other third pads 839c may be electrically connected to the fourth pads 549c included in the fourth layer 840 through the third vias 838 provided within the third base substrate 833.

The fourth layer 840 may include the fourth base substrate 843, the third magnetic field shielding unit 845 and the fourth pads 849c provided on the fourth base substrate 843, and the like. Also, a plurality of fifth pads 800, a protective layer 830, solder bumps 940, and the like, may be provided on a lower surface of the fourth layer 840. The plurality of fifth pads 880 may electrically connect the semiconductor package 900 to an external device. The protective layer 830 may protect the fifth pads 880. The solder bumps 940 may connect the fifth pads 880 to electrodes, pads, and the like, of an external device. The fourth pads 849c provided on an upper surface of the fourth base substrate 8443 and the fifth pads 880 provided on a lower surface of the fourth base substrate 843 may be electrically connected through the vias 848 provided within the fourth base substrate 848.

In the exemplary embodiment illustrated in FIG. 14, the magnetic field shielding units 825, 835, and 845 may include a ferromagnetic material, for example, iron (Fe), an iron-cobalt (Fe—Co) alloy, a nickel-iron (Ni—Fe) alloy, and the like. In case of an alloy, the magnetic field shielding units 825, 835, and 845 may be formed of a material such as Permalloy. Also, the magnetic field shielding units 825, 835, and 845 may be formed in different positions on a plane of the package substrate 800 and may include at least partial overlapping regions.

Meanwhile, the third magnetic field shielding unit 845 may overlap with the entirety of the plurality of via holes 826 provided in the first magnetic field shielding unit 825. If the plurality of via holes 826 provided in the first magnetic field shielding unit 825 do not overlap with the third magnetic field shielding unit 845, a magnetic field introduced through the package substrate 800 may be transmitted even to the semiconductor device 910 along the via holes 826 and the first and second vias 818 and 828 formed through the via holes 826. Thus, in the present exemplary embodiment, in order to effectively shield a magnetic field, the third magnetic field shielding unit 845 may overlap with the entirety of the via holes 826 of the first magnetic field shielding unit 825.

In the exemplary embodiments described above with reference to FIGS. 12A through 12D, 13A, 13B, and 14, the magnetic field shielding units 825, 835, and 845 may be connected to a predetermined constant voltage source. In this case, the magnetic field shielding units 825, 835, and 845 may also serve to shield electrical noise transmitted from the outside.

Figure 15:
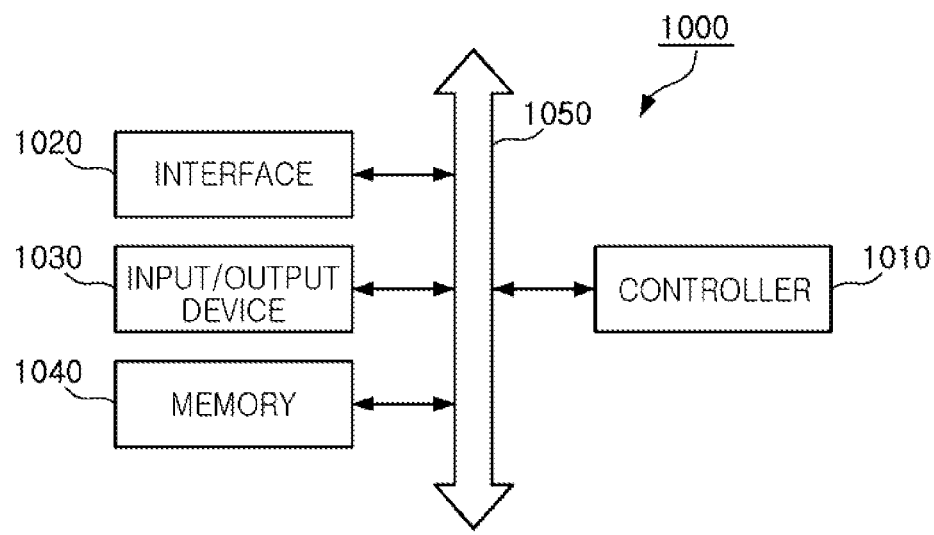
FIGS. 15 and 16 are block diagrams illustrating an electronic device including a non-volatile memory device according to an exemplary embodiment of the present disclosure.
Figure 16:
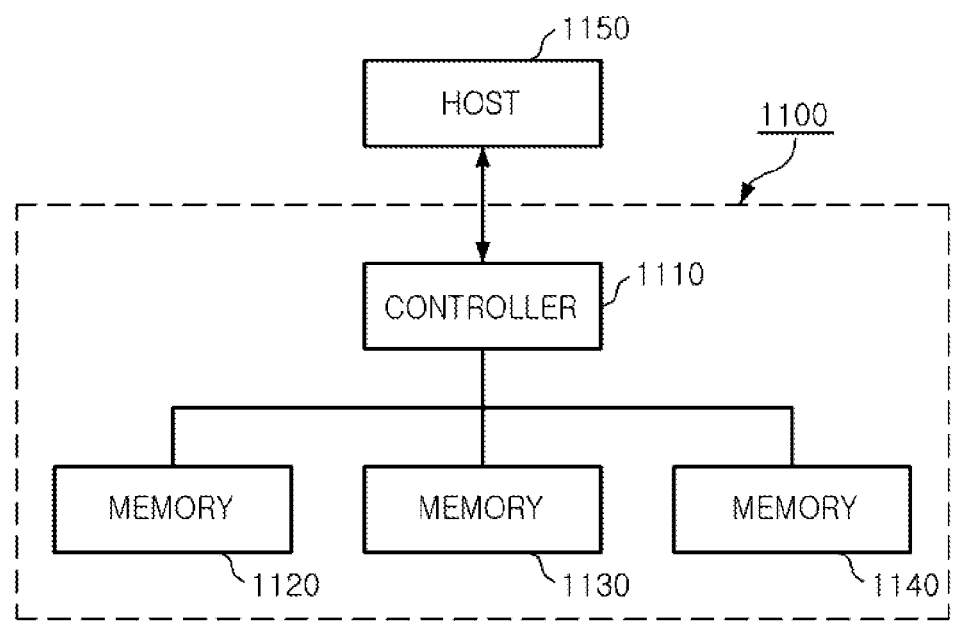

FIGS. 15 and 16 are block diagrams illustrating an electronic device including a semiconductor package according to an exemplary embodiment of the present disclosure.

FIG. 15 is a view illustrating an electronic device 1000 including a semiconductor package according to an exemplary embodiment of the present disclosure. Referring to FIG. 15, the electronic device 1000 according to the present exemplary embodiment may include a controller 1010, an interface 1020, an input/output device 1030, a memory 1040, and the like. The controller 1010, the interface 1020, the input/output device 1030, the memory 1040, and the like, may be connected through a bus 1050 providing a passage (or a path) where data is transmitted.

The controller 1010 may include an element such as at least one microprocessor, digital signal processor, microcontroller, and the like. The memory 1040 may include an element that may be able to read and write data in various manners. The controller 1010 and the memory 1040 may include any one of the semiconductor packages according to various exemplary embodiments described above with reference to FIGS. 1 through 14.

The input/output device 1030 may include a keypad, a keyboard, a touch screen device, a display device, an audio input/output module, and the like. The interface 1020 may be a module transmitting and receiving data via a communications network and may include an antenna, a wired/wireless transceiver, and the like. Also, In addition to the components illustrated in FIG. 15, the electronic device 1000 may further include an application chip set, an imaging device, and the like. The electronic device 1000 illustrated in FIG. 15 may not limited to a category thereof, and may be various devices such as a personal digital assistant (PDA), a portable computer, a mobile phone, a wireless phone, a laptop computer, a memory card, a portable media player, a tablet PC, and the like.

FIG. 16 is a block diagram illustrating a storage device 1100 including a semiconductor package according to an exemplary embodiment of the present disclosure. Referring to FIG. 16, the storage device 1100 according to the exemplary embodiment of the present disclosure may include a controller 1110 communicating with a host 1150 and memories 1120, 1130, and 1140 storing data. The controller 1110 and the memories 1120, 1130, and 1140 may include the semiconductor packages according to various exemplary embodiments described above with reference to FIGS. 1 through 14.

The host 1150 communicating with the controller 1110 may be various electronic devices in which the storage device 1110 is installed. For example, the host 1150 may be a smartphone, a digital camera, a desktop computer, a laptop computer, a media player, and the like. Upon receipt of a data write or read request from the host 1150, the controller 1110 may generate a command CMD for storing data to the memories 1120, 1130, and 1140 or may retrieve data from the memories 1120, 1130, and 1140.

As illustrated in FIG. 16, one or more memories 1120, 1130, and 1140 may be connected to the controller 1110 in parallel within the storage device 1100. By connecting the plurality of memories 1120, 1130, and 1140 to the controller 1110 in parallel, the storage device 1100 having large quantity may be implemented.

As set forth above, in the case of the circuit substrate according to exemplary embodiments of the present disclosure, since a magnetic field shielding unit having the area greater than or equal to that of a mounting region in which a semiconductor device is disposed is disposed in a region corresponding to the mounting region, a magnetic field that may be introduced from the outside may be effectively blocked, thus, improving operation reliability of the semiconductor device.

Advantages and effects of the present disclosure are not limited to the foregoing content and may be easily understood from the described specific exemplary embodiments of the present disclosure.

While exemplary embodiments have been shown and described above, it will be apparent to those skilled in the art that modifications and variations could be made without departing from the spirit and scope of the present disclosure as defined by the appended claims.

What is claimed is:

1. A package substrate comprising:
a body unit including a plurality of base substrates and having a mounting region allowing at least one semiconductor device to be mounted thereon; and
a plurality of magnetic field shielding units including a ferromagnetic material and provided within the body unit, each of the magnetic field shielding units having an area overlapping less than all of the mounting region in plan view, the area being different than an area of at least one other magnetic field shielding unit in plan view,
wherein the plurality of magnetic field shielding units are respectively disposed on the plurality of base substrates such that a magnetic field shielding region defined by a combination of the plurality of magnetic field shielding units overlaps all of the mounting region in plan view.

2. The package substrate of claim 1, wherein the magnetic field shielding region has an area greater than or equal to that of the mounting region in plan view.

3. The package substrate of claim 1, wherein an area of at least one of the plurality of magnetic field shielding units overlaps an area of another of the plurality of magnetic field shielding units within the magnetic field shielding region in plan view.

4. The package substrate of claim 1, wherein the plurality of magnetic field shielding units include at least one of iron (Fe), cobalt (Co), and nickel (Ni).

5. The package substrate of claim 1, wherein the mounting region includes solder bumps formed on one surface of the body unit and electrically connected to electrodes of the one or more semiconductor devices.

6. The package substrate of claim 1, wherein the at least one semiconductor device includes a magnetic memory device.

7. The package substrate of claim 1, wherein the plurality of magnetic field shielding units are disposed in different positions within the body unit in a thickness direction of the body unit.

8. The package substrate of claim 1, further comprising a housing covering the at least one semiconductor device and including a ferromagnetic material.

9. The package substrate of claim 1, wherein the body unit comprises:
- a plurality of circuit patterns respectively disposed on the plurality of base substrates; and
- a plurality of vias penetrating through at least one of the plurality of base substrates and electrically connecting the plurality of circuit patterns respectively disposed on the plurality of base substrates.

10. The package substrate of claim 9, wherein the plurality of circuit patterns are electrically separated from the plurality of magnetic field shielding units.

11. The package substrate of claim 9, wherein the plurality of circuit patterns include a power source circuit pattern supplying at least one of a source voltage and a ground voltage, and at least a portion of the plurality of magnetic field shielding units is disposed to be adjacent to the power source circuit pattern.

12. The package substrate of claim 9, wherein at least a portion of the plurality of the magnetic field shielding units overlap each other so that the plurality of vias do not penetrate from a first surface of the body unit to a second surface of the body unit opposite to the first surface.

13. The package substrate of claim 9, wherein at least one of the plurality of magnetic field shielding units has a via hole penetrated by at least a portion of the plurality of vias.

14. The package substrate of claim 13, wherein the at least the portion of the vias is electrically separated from the at least one of the plurality of the magnetic field shielding units having the via hole within the via hole.

15. The package substrate of claim 13, wherein the via hole overlaps with another of the plurality of magnetic field shielding units in plan view.

\* \* \* \* \*